(12) United States Patent
Hishida et al.

(10) Patent No.: US 11,552,095 B2
(45) Date of Patent: *Jan. 10, 2023

(54) SEMICONDUCTOR MEMORY HAVING FIRST AND SECOND MEMORY CELL REGIONS SEPARATED BY A THIRD REGION ALONG A BIT LINE DIRECTION

(71) Applicant: KIOXIA CORPORATION, Tokyo (JP)

(72) Inventors: Tomoo Hishida, Kamakura Kanagawa (JP); Sadatoshi Murakami, Yokohama Kanagawa (JP); Ryota Katsumata, Yokkaichi Mie (JP); Masao Iwase, Yokkaichi Mie (JP)

(73) Assignee: KIOXIA CORPORATION, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 17/214,710

(22) Filed: Mar. 26, 2021

(65) Prior Publication Data

US 2021/0217755 A1 Jul. 15, 2021

Related U.S. Application Data

(63) Continuation of application No. 16/815,852, filed on Mar. 11, 2020, now Pat. No. 10,971,511, which is a (Continued)

(30) Foreign Application Priority Data

Mar. 13, 2014 (JP) ................................. 2014-050568

(51) Int. Cl.
*H01L 27/1157* (2017.01)
*H01L 21/8234* (2006.01)
(Continued)

(52) U.S. Cl.
CPC .. *H01L 27/1157* (2013.01); *H01L 21/823437* (2013.01); *H01L 27/11575* (2013.01); *H01L 27/11582* (2013.01)

(58) Field of Classification Search
CPC ........... H01L 27/1157; H01L 27/11582; H01L 27/11575; H01L 21/823437
See application file for complete search history.

(56) References Cited

U.S. PATENT DOCUMENTS 9,368,683 B1 6/2016 Meitl et al.
9,502,299 B2 11/2016 Hishida et al.
(Continued)

FOREIGN PATENT DOCUMENTS

JP 2009146954 A 7/2009
TW 481920 4/2002

OTHER PUBLICATIONS

Chinese Office Action dated May 27, 2017 in related Chinese Patent Application No. 201410453133.4, 9 pages (with translation).
(Continued)

*Primary Examiner* — Mamadou L Diallo
(74) *Attorney, Agent, or Firm* — Kim & Stewart LLP

(57) ABSTRACT

A semiconductor memory includes a memory cell region that includes multiple memory cells stacked above a semiconductor substrate, first and second dummy regions on opposite sides of the memory cell region, each dummy region including multiple dummy cells stacked above the semiconductor substrate, and a wiring that electrically connects dummy cells of the first and second dummy regions that are at a same level above the semiconductor substrate.

12 Claims, 15 Drawing Sheets

Related U.S. Application Data continuation of application No. 16/262,827, filed on Jan. 30, 2019, now Pat. No. 10,622,372, which is a continuation of application No. 16/104,843, filed on Aug. 17, 2018, now Pat. No. 10,199,387, which is a continuation of application No. 15/708,033, filed on Sep. 18, 2017, now Pat. No. 10,056,403, which is a continuation of application No. 15/349,907, filed on Nov. 11, 2016, now Pat. No. 9,768,188, which is a continuation of application No. 14/475,440, filed on Sep. 2, 2014, now Pat. No. 9,502,299.

(51) Int. Cl.
*H01L 27/11575* (2017.01)
*H01L 27/11582* (2017.01)

(56) References Cited

U.S. PATENT DOCUMENTS

| | | | |
|---|---|---|---|
| 9,768,188 B2 | 9/2017 | Hishida et al. | |
| 2009/0194856 A1 | 8/2009 | Gomez | |
| 2010/0020608 A1* | 1/2010 | Kamigaichi | G11C 5/063 |
| | | | 365/185.05 |
| 2011/0121403 A1* | 5/2011 | Lee | H01L 27/11551 |
| | | | 257/E27.06 |
| 2013/0093103 A1 | 4/2013 | Kim et al. | |
| 2013/0270568 A1* | 10/2013 | Rabkin | G11C 16/06 |
| | | | 438/156 |
| 2014/0085961 A1* | 3/2014 | Kanamori | H01L 27/249 |
| | | | 365/72 |
| 2015/0270280 A1* | 9/2015 | Simsek-Ege | H01L 21/02532 |
| | | | 257/66 |
| 2015/0325303 A1* | 11/2015 | Hashimoto | G11C 7/14 |
| | | | 365/185.11 |
| 2015/0372187 A1 | 12/2015 | Bower et al. | |
| 2016/0064075 A1* | 3/2016 | Miyakawa | G11C 13/0021 |
| | | | 365/158 |
| 2016/0086855 A1 | 3/2016 | Bower et al. | |
| 2016/0308103 A1 | 10/2016 | Hu et al. | |
| 2018/0006042 A1 | 1/2018 | Hishida et al. | |

OTHER PUBLICATIONS

Taiwan Office Action dated May 2, 2017, filed in Taiwan counterpart Application No. 105125489, 5 pages (with translation).
Taiwan Office Action dated Nov. 17, 2015, filed in Taiwan counterpart Application No. 103122862, 6 pages (with translation).

* cited by examiner

SEMICONDUCTOR MEMORY HAVING FIRST AND SECOND MEMORY CELL REGIONS SEPARATED BY A THIRD REGION ALONG A BIT LINE DIRECTION

CROSS-REFERENCE TO RELATED APPLICATIONS

This application is a continuation of U.S. patent application Ser. No. 16/815,852, filed Mar. 11, 2020, which is a continuation of U.S. patent application Ser. No. 16/262,827, filed Jan. 30, 2019, now U.S. Pat. No. 10,622,372, issued Apr. 14, 2020, which is a continuation of U.S. patent application Ser. No. 16/104,843, filed Aug. 17, 2018, now U.S. Pat. No. 10,199,387, issued Feb. 5, 2019, which is a continuation of U.S. patent application Ser. No. 15/708,033, filed Sep. 18, 2017, now U.S. Pat. No. 10,056,403, issued Aug. 21, 2018, which is a continuation of U.S. patent application Ser. No. 15/349,907, filed Nov. 11, 2016, now U.S. Pat. No. 9,768,188, issued Sep. 19, 2017, which is a continuation of Ser. No. 14/475,440, filed Sep. 2, 2014, now U.S. Pat. No. 9,502,299, issued Nov. 22, 2016, which is based upon and claims the benefit of priority from Japanese Patent Application No. 2014-050568, filed Mar. 13, 2014, the entire contents of each of which are incorporated herein by reference.

FIELD

Embodiments described herein relate generally to a semiconductor memory.

BACKGROUND

In the recent years, a stack type flash memory that has a structure in which a memory cell is stacked is proposed as an approach to improving the bit density of flash memory. With the adoption of the stack type flash memory, the high capacity semiconductor memory may be realized at a low cost.

DETAILED DESCRIPTION

Figure 1:
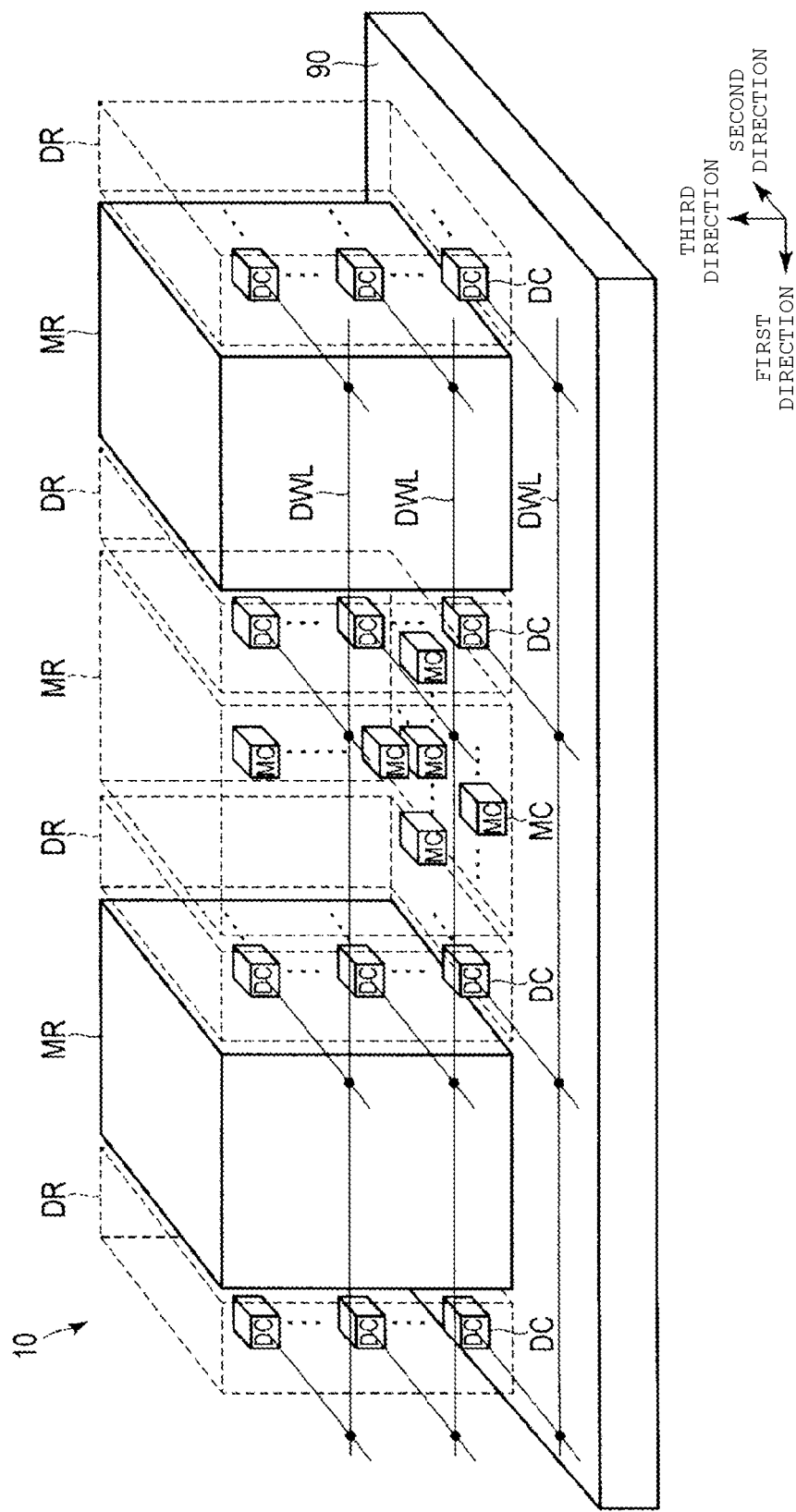
FIG. 1 is a diagram for illustrating a basic configuration of a semiconductor memory according to an embodiment.

The present embodiment now will be described more fully hereinafter with reference to the accompanying drawings, in which various embodiments are shown. In the drawings, the thickness of layers and regions may be exaggerated for clarity. Like numbers refer to like elements throughout. As used herein the term "and/or" includes any and all combinations of one or more of the associated listed items and may be abbreviated as "/".

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises," "comprising," "having," "includes," "including" and/or variations thereof, when used in this specification, specify the presence of stated features, regions, steps, operations, elements, and/or components, but do not preclude the presence or addition of one or more other features, regions, steps, operations, elements, components, and/or groups thereof.

It will be understood that when an element such as a layer or region is referred to as being "on" or extending "onto" another element (and/or variations thereof), it may be directly on or extend directly onto the other element or intervening elements may also be present. In contrast, when an element is referred to as being "directly on" or extending "directly onto" another element (and/or variations thereof), there are no intervening elements present. It will also be understood that when an element is referred to as being "connected" or "coupled" to another element (and/or variations thereof), it may be directly connected or coupled to the other element or intervening elements may be present. In contrast, when an element is referred to as being "directly connected" or "directly coupled" to another element (and/or variations thereof), there are no intervening elements present.

It will be understood that, although the terms first, second, etc. may be used herein to describe various elements, components, regions, layers and/or sections, these elements, materials, regions, layers and/or sections should not be limited by these terms. These terms are only used to distinguish one element, material, region, layer or section from another element, material, region, layer or section. Thus, a first element, material, region, layer or section discussed below could be termed a second element, material, region, layer or section without departing from the teachings of the present invention.

Relative terms, such as "lower", "back", and "upper" may be used herein to describe one element's relationship to another element as illustrated in the Figures. It will be understood that relative terms are intended to encompass different orientations of the device in addition to the orientation depicted in the Figures. For example, if the structure in the Figure is turned over, elements described as being on the "backside" of substrate would then be oriented on "upper" surface of the substrate. The exemplary term "upper", may therefore, encompass both an orientation of "lower" and "upper," depending on the particular orientation of the figure. Similarly, if the structure in one of the figures is turned over, elements described as "below" or "beneath" other elements would then be oriented "above" the other elements. The exemplary terms "below" or "beneath" may, therefore, encompass both an orientation of above and below.

Embodiments are described herein with reference to cross sections and perspective illustrations that are schematic illustrations of embodiments. As such, variations from the shapes of the illustrations as a result, for example, of manufacturing techniques and/or tolerances, are to be expected. Thus, embodiments should not be construed as limited to the particular shapes of regions illustrated herein but are to include deviations in shapes that result, for example, from manufacturing. For example, a region illustrated or described as flat may, typically, have rough and/or nonlinear features. Moreover, sharp angles that are illustrated, typically, may be rounded. Thus, the regions illustrated in the figures are schematic in nature and their shapes are not intended to illustrate the precise shape of a region and are not intended to limit the scope of the present invention.

A technology is proposed that improves reliability of a semiconductor memory.

In general, according to one embodiment, a semiconductor memory includes a memory cell region that includes multiple memory cells stacked above a semiconductor substrate, first and second dummy regions on opposite sides of the memory cell region, each dummy region including multiple dummy cells stacked above the semiconductor substrate, and a wiring that electrically connects dummy cells of the first and second dummy regions that are at a same level above the semiconductor substrate.

The present embodiment is described in detail below with referring to the drawings. In the following description, elements having the same function and configuration are given like reference numerals, and overlapping descriptions are provided whenever necessary.

1. Basic Embodiment

A basic configuration of a semiconductor memory according to the present embodiment is described with referring to FIG. 1.

As illustrated in FIG. 1, a semiconductor memory according to the present embodiment includes a memory cell array 10 that includes multiple memory cells MC. Within the memory cell array 10, the multiple memory cells MC are arranged in two directions (first direction and second direction, which are orthogonal with respect to each other) parallel to a surface of a substrate 90 and are stacked in a direction (third direction orthogonal to the first and second directions) perpendicular to the surface of the substrate 90.

A memory cell array 10 includes multiple memory cell regions MR. Each memory cell region MR includes the multiple memory cells MC. A word line (not illustrated) and a bit line (not illustrated) are electrically connected to each memory cell MC.

The memory cell array 10 includes multiple dummy regions DR. For example, each dummy region DR is provided in such a way as to be adjacent to the memory cell region.

The dummy region DR includes multiple dummy cells DC. The dummy cell DC has substantially the same structure as the memory cell MC.

In the semiconductor memory according to the present embodiment, the multiple dummy regions DR are connected to common wiring DWL. For example, each common wiring DWL connects electrically the multiple dummy cells DC that are positioned on the same layer in the multiple dummy region DR.

In the semiconductor memory according to the present embodiment, a voltage may be applied to the multiple dummy cells DC of the multiple dummy regions DR collectively, and the multiple dummy cells DC may be driven at the same time. For example, a test for detecting a defect in memory may be performed on the multiple dummy regions DR at the same time.

As a result, in the semiconductor memory according to the present embodiment, an increase in time and cost for testing the memory may be suppressed.

According to the present embodiment, with the ease of defect detection, it is possible to provide a high-reliability semiconductor memory.

2. Embodiments a. Configuration Example

A semiconductor memory according to a first embodiment is described with referring to FIGS. 2 to 6.

Figure 2:
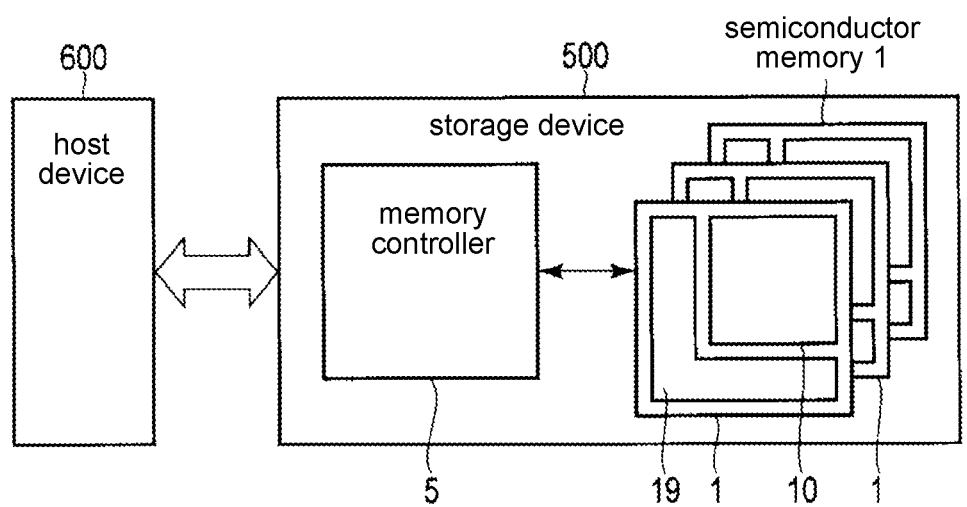
FIG. 2 is a diagram illustrating an entire configuration of a device including the semiconductor memory according to the embodiment.

FIG. 2 is a diagram illustrating a configuration example of a storage device that includes a semiconductor memory according to an embodiment.

As illustrated in FIG. 2, a storage device 500 includes a memory controller 5 and a semiconductor memory 1 according to the present embodiment.

A storage device 500 is electrically connected to a host device 600 using a connector based on a certain standard, over wireless (or wired) communication, the Internet, or the like. The storage device 500 and the host device 600 perform data transmission and reception, based on an interface standard that is established between the devices 500 and 600.

The storage device 500 includes at least one semiconductor memory 1.

The memory controller 5 controls the semiconductor memory 1. The memory controller 5, for example, performs a write operation, a read operation, and an erasing operation on the semiconductor memory 1, based on a command from the host device 600. At the time of the write operation, the memory controller 5 transmits data to the semiconductor memory 1 from outside of the storage device 500 (for example, the host device). At the time of the read operation, the memory controller 5 transmits data to outside of the storage device 500 from the semiconductor memory 1.

The storage device 500 and the host device 600 make up a memory system.

The storage device 500, or the memory system that includes the storage device 500 is a memory card such as an SD™ card, a USB memory, or a solid state drive (SSD).

The semiconductor memory 1 according to the present embodiment, for example, is a flash memory.

The flash memory 1 includes a memory cell array 10 including multiple memory cells, and a peripheral circuit 19 for executing an operation on the memory cell array 10.

The peripheral circuit 19 includes a low control circuit that controls the word line, a sense amplifier circuit for reading data, a voltage generation circuit that generates voltages that are used for operations within a chip, a voltage control circuit 199 that controls voltages of each structural element within the chip, and the like.

Figure 3:
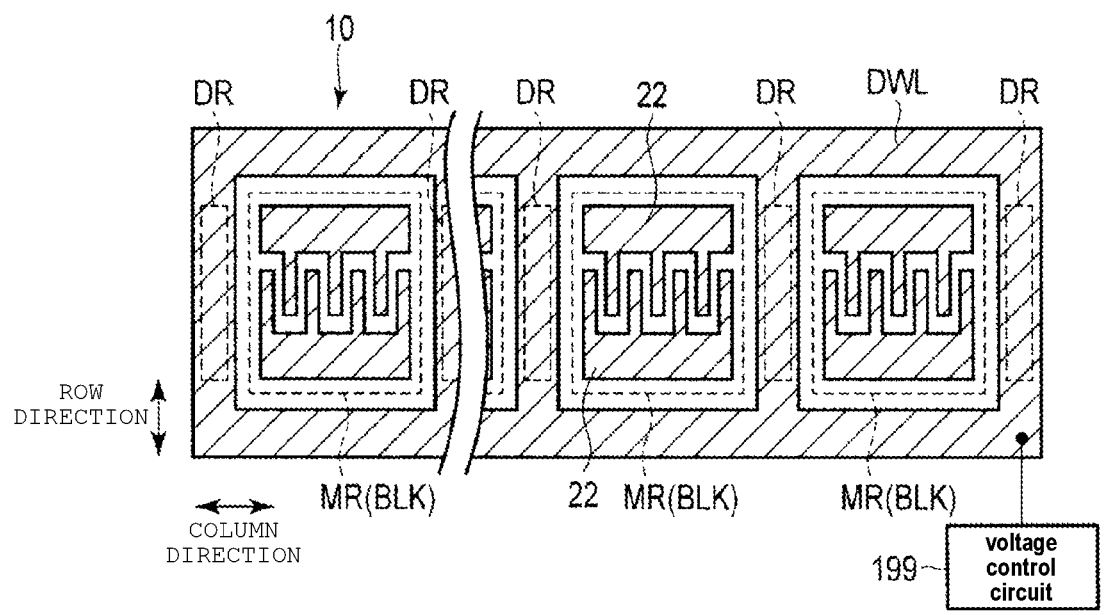
FIG. 3 is a schematic diagram illustrating a structure example of the semiconductor memory according to the embodiment.

FIG. 3 illustrates one internal configuration example of the memory cell array 10.

A memory cell array 10 includes multiple memory cell regions MR. If the flash memory 1 is a NAND flash memory, for example, the memory cell region MR corresponds to a block, which is a control unit of the erasing operation.

A configuration of the memory cell array 10 and a method of manufacturing the memory cell array 10 are disclosed in U.S. patent application Ser. No. 12/407,403 titled "THREE DIMENSIONAL STACKED NONVOLATILE SEMICONDUCTOR MEMORY", filed on Mar. 19, 2009. Furthermore, the configuration of the memory cell array 10 and the method of manufacturing the memory cell array 10 are disclosed in U.S. patent application Ser. No. 12/406,524, titled "THREE DIMENSIONAL STACKED NONVOLATILE SEMICONDUCTOR MEMORY", filed on Mar. 18, 2009, U.S. patent application Ser. No. 12/679,991, titled "NON-VOLATILE SEMICONDUCTOR STORAGE DEVICE AND METHOD OF MANUFACTURING THE SAME", filed on Mar. 25, 2010, and U.S. patent application Ser. No. 12/532,030, titled "SEMICONDUCTOR MEMORY AND METHOD FOR MANUFACTURING SAME", filed on Mar. 23, 2009. These patent applications are incorporated by reference in their entirety herein.

According to the present embodiment, a conductive layer 22 in the shape of comb teeth is stacked within the memory cell region MR, and the memory cell region MR includes each conductive layer 22 as the word line.

Areas that are independent of one another within the memory cell array 10 include dummy regions DR, respectively.

Each dummy region DR is adjacent to the memory cell region (block) MR in the extending direction (column direction) of the bit line. For example, the dummy region DR and the memory cell region MR are parallel to each other in the column direction.

As a result, a space is secured between the adjacent memory cell regions MR. Accordingly, while the memory is in operation, a difference in voltage between the word lines in the adjacent memory cell regions (blocks) MR is alleviated and a margin of a breakdown voltage is secured at a boundary of the memory cell region MR.

Moreover, the dummy region DR may be treated as a region of the block, and may be treated as a region that is independent of the block. If the dummy region DR is a region of the block, one block includes one memory cell region MR and at least one dummy region DR.

In a three-dimensionally structured NAND flash memory, according to the present embodiment, the common wiring DWL connects the multiple dummy regions DR electrically.

The wiring DWL that is in common connected to the multiple dummy regions DR is connected to the voltage control circuit 199.

Figure 4:
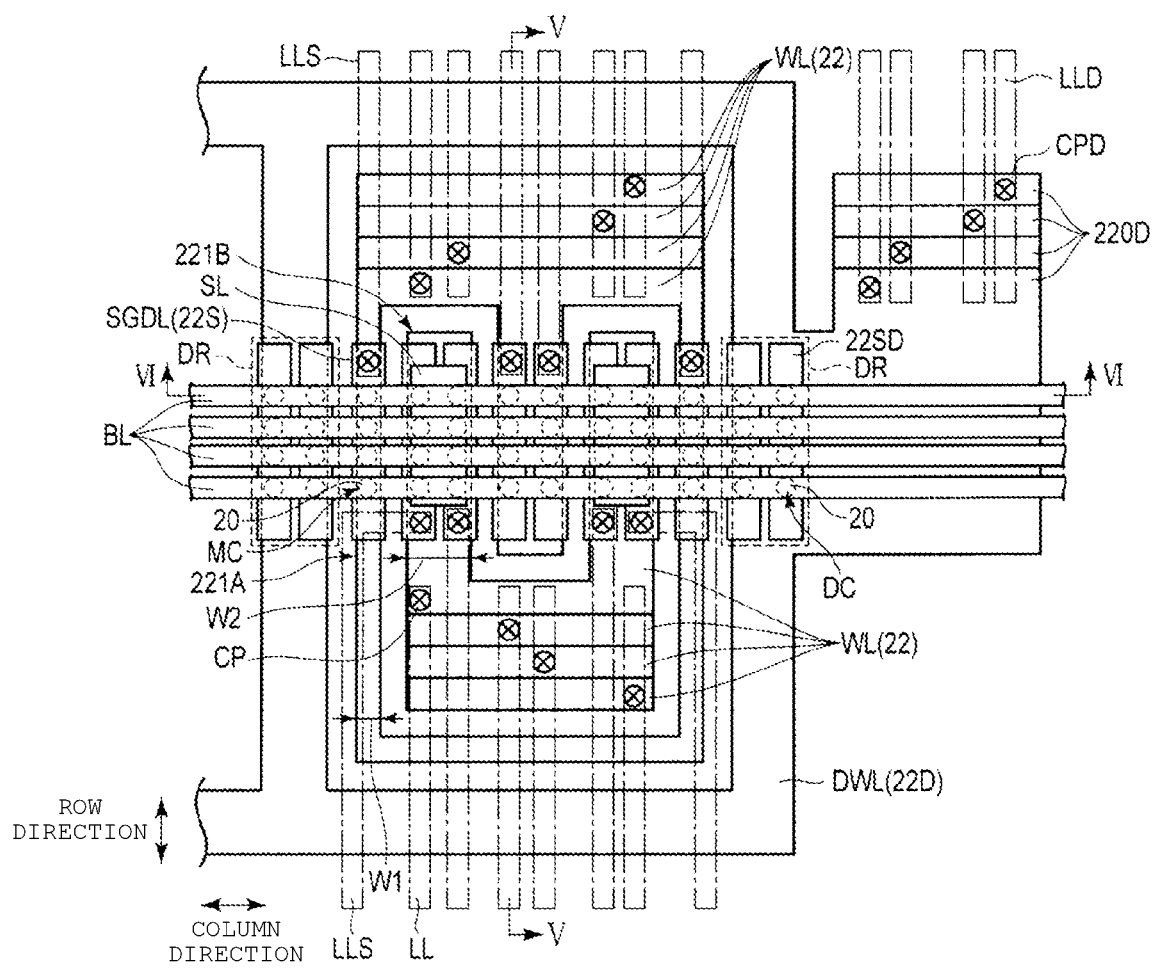
FIG. 4 is a plan diagram illustrating a structure example of the semiconductor memory according to the embodiment.
Figure 5:
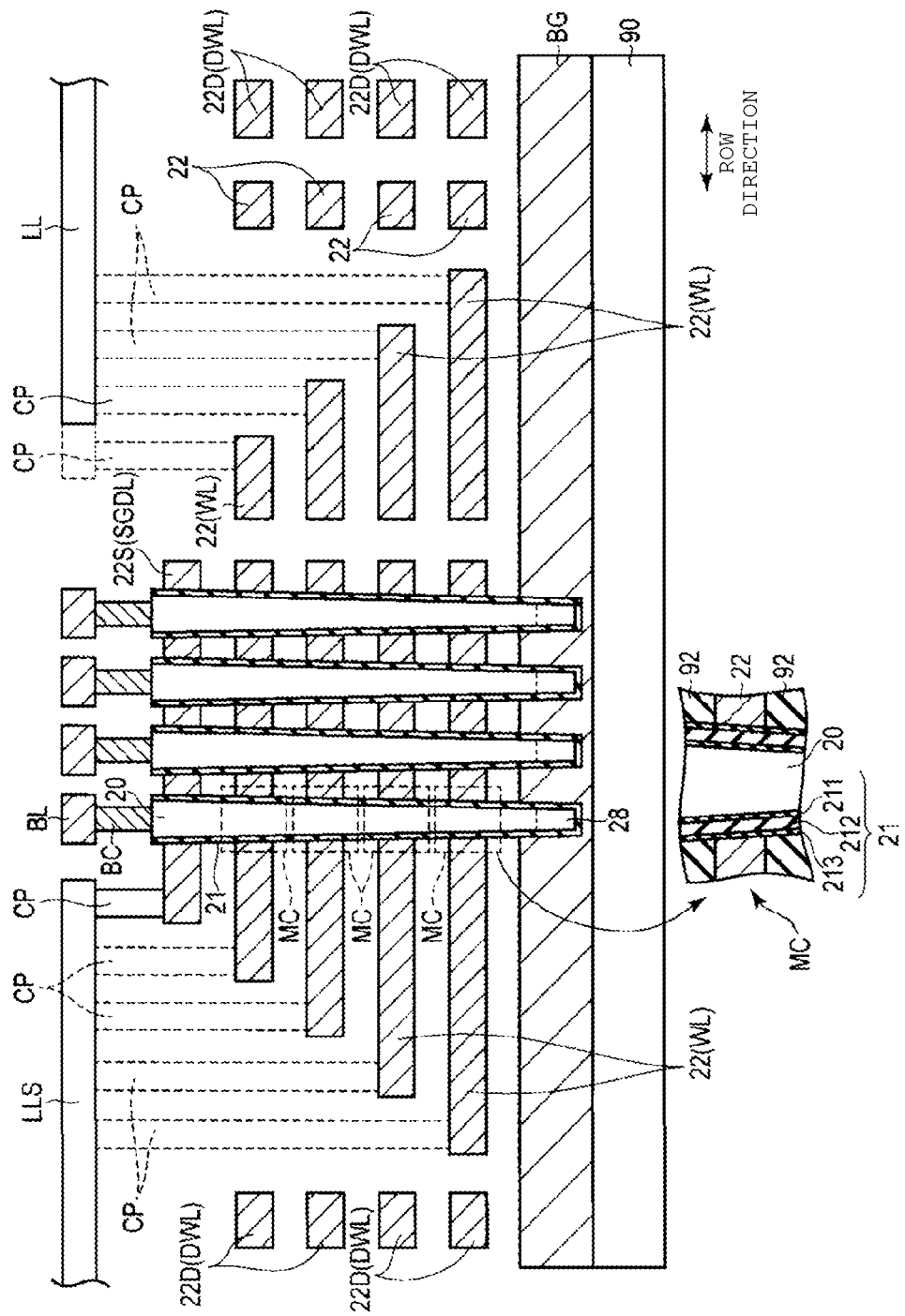
FIG. 5 is a cross-sectional diagram illustrating a structure example of the semiconductor memory according to the embodiment.
Figure 6:
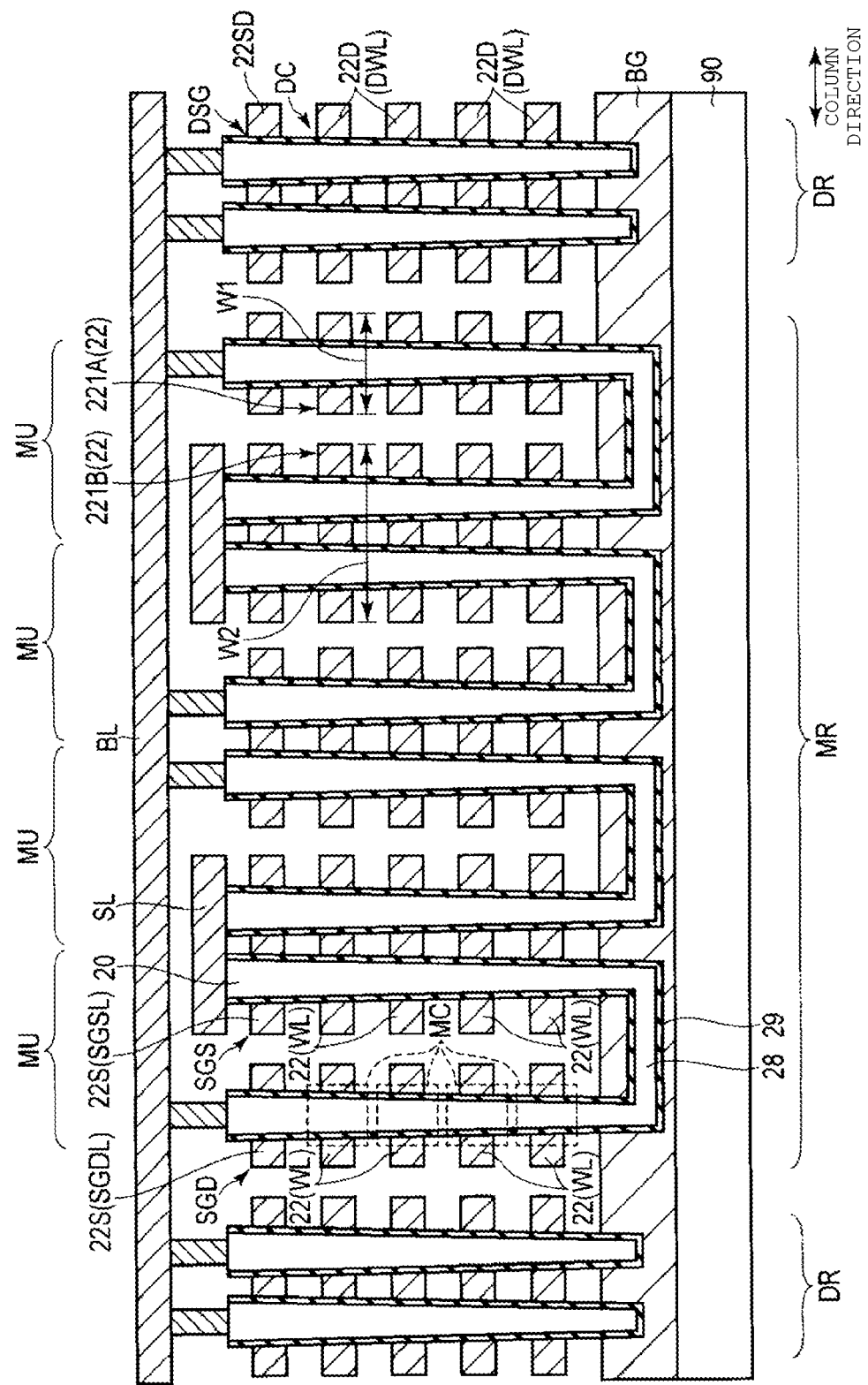
FIG. 6 is a cross-sectional diagram illustrating a structure example of the semiconductor memory according to the embodiment.

A structural example of the memory cell region and the dummy region that are included in the flash memory according to the present embodiment are described with referring to FIGS. 4 to 6.

Moreover, FIGS. 4 to 6 illustrate one memory cell region within the memory cell array 10, and the dummy region in the vicinity of the one memory cell region, which are all part of the flash memory according to the present embodiment. In FIGS. 5 and 6, illustrations of an interlayer insulating film are omitted for clarity.

As illustrated in FIGS. 4 to 6, in each memory cell region (block) MR within the memory cell array 10, the multiple memory cells MC are stacked on the substrate 90, in parallel to one another along the row direction and the column direction and in the direction perpendicular to the surface of the substrate 90.

Each memory cell MC includes a semiconductor pillar that extends in the direction perpendicular to the surface of the substrate 90, a control gate electrode 22, and a stacked insulating film 21 between the semiconductor pillar 20 and the control gate electrode 22. The stacked insulating film 21, as illustrated in FIG. 5, includes a gate insulating film (tunnel insulating film) 211 that covers a lateral face of the semiconductor pillar 20, a charge storage layer (charge trap layer) 212 on the gate insulating film 211, and an insulating film (referred to as an inter-gate insulating film or also as a block insulating film) 213 on the charge storage layer 212.

The multiple conductive layers that make up the control gate electrode 22 and multiple insulating layers between them (not illustrated) are stacked on the substrate 90. The control gate electrode 22 of each memory cell MC is formed from each of the multiple conductive layers 22. A channel region of a transistor is formed from the semiconductor pillar 20.

For example, a semiconductor layer (hereinafter referred to as a pipe portion) 28 connects lower ends of two semiconductor pillar 20 electrically. A memory cell unit (NAND string) MU of the flash memory includes the multiple memory cells MC that are formed from the multiple semiconductor pillars 20 that are connected by the pipe portion 28.

Select transistors SGD and SGS are present at the upper ends of the two semiconductor pillars 20 that form the memory cell unit MU, respectively. The select transistors SGD and SGS are provided on an upper portion of the stacked memory cell MC in such a way that the select transistors SGD and SGS are connected to the conductive layers 22S as select gate lines SGDL and SGSL. Each of the drain-side select gate line SGDL and the source-side select gate line SGSL extends in the row direction in a layer higher than the conductive layers 22 serving as word lines WL.

The bit line contact BC connects a bit line BL electrically to the semiconductor pillar 20 that is aligned with the drain-side select transistor SGD. A source line contact (not illustrated) connects a source line SL electrically to the semiconductor pillar 20 that is aligned with the source-side select transistor SGS. The source line SL electrically connects in common the semiconductor pillars 20 of different memory cell units MU.

The pipe portion 28 is disposed within the conductive layer (hereinafter referred to as a back gate layer) BG with an insulating film 29 interposed therebetween. The back gate transistor is operated to electrically connect the lower ends of the two semiconductor pillars 20.

Each of the stacked conductive layers (control gate electrodes) 22 extends along the direction (for example, the row direction) parallel to the substrate 90 in such a way that each stacked conductive layer connects electrically the multiple memory cells MC that are arranged at a same height above the substrate 90 as the conductive layer. The control gate electrode 22 functions as the word line WL of the flash memory.

According to the present embodiment, as illustrated in FIG. 4, the conductive layer 22 has a planar shape in which multiple protrusion portions 221 that protrudes in the direction parallel to the surface of the substrate are connected to a rectangular plate 220.

A memory hole (through hole) passes through the protrusion portion 221. The semiconductor pillar 20 is provided within the memory hole. The plate 220 is connected electrically to a contact plug CP as an extension portion of the word line WL (control gate electrode).

In the flash memory 1 according to the present embodiment, each of the conductive layers 22 in the shape of comb teeth has a pattern that is independent of every memory cell region MR and does not straddle multiple memory cell regions MR.

For example, within the memory cell region MR, the two conductive layers 22 in the shape of comb teeth face each other on the same layer in such a way that among two conductive layers 22 in the shape of comb teeth on the same layer, a protrusion portion of one conductive layer 22 is arranged between protrusion portions of the other conductive layer 22.

For example, in each of the memory cell regions MR, a line width W1 of a protrusion portion 221A in a termination portion (in the direction of the neighboring dummy region DR) in the column direction is smaller than a line width W2 of a protrusion portion 221B other than the termination portion in the column direction. For example, the line width W1 of the protrusion portion 221A is approximately half of the line width W2 of the protrusion portion 221B. Moreover, a line width of each of the dummy region DR and the dummy wiring DWL is greater than the line width W1 of the protrusion portion 221A in the termination portion in the column direction in the memory cell region MR, and is equal to or less than the width W2 of the protrusion portion 221B other than the termination portion in the column direction. Moreover, the line width of each of the dummy region DR and the dummy wiring DWL may be greater than the line width W2 of the protrusion portion 221B.

For example, the two semiconductor pillars 20, which pass through the two memory holes adjacent to each other in the column direction, are provided in the protrusion portions 221B, respectively. The two semiconductor pillars 20 adjacent to each other in the column direction, which are connected to the common protrusion portion 221B are connected to the pipe portions 28 that are different from each other. The two semiconductor pillars 20 adjacent to each other in the column direction within the common protrusion portion 221B forms the memory cell units MU that are different from each other.

Among the two conductive layers 22 in the shape of comb teeth that face each other on the same layer in each memory cell region MR, a first end side protrusion and a second end side protrusion in the column direction, of one conductive layer 22, are positioned in a termination portion of the memory cell region MR. The one conductive layer 22 includes a pattern in the shape of a closed loop in such a way that the first end side and the second end side protrusion portions 221A in the column direction, of the one conductive layer 22, are connected electrically to each other.

A stack structure that includes the conductive layers 22 in the shape of comb teeth is processed in the shape of stairs in such a way that a space in which the conductive layer that is a lower conductive layer does not cover the conductive layer that is a higher conductive layer, is formed in the direction that faces the protrusion portion in the direction parallel to the surface of the substrate, that is, formed in the plate of the conductive layer 22. Accordingly, a space in which the contact plug CP is arranged is secured in the stacked conductive layer (word line) 22.

Each dummy cell DC includes a conductive layer 22D as a gate electrode (control gate electrode) of the dummy cell DC, the semiconductor pillar 20 that intersects the conductive layer 22, and the stacked insulating film 21 between the semiconductor pillar 20 and the conductive layer 22D. The dummy region DR is hereinafter referred to as a dummy cell region DR.

In the dummy cell region DR, the dummy select transistor DSG is provided on an upper portion of the stacked dummy cell DC, a position of a conductive layer (hereinafter referred to as a dummy select gate line) 22SD that is the highest of the conductive layers in the stack structure. The dummy select transistor DSG is present on the same layer as the select transistors SGD and SGS.

As illustrated in FIGS. 4 to 6, within each dummy cell region DR, the multiple semiconductor pillars 20 are parallel to one another in the column direction and in the row direction. In the example illustrated in FIGS. 4 and 6, the semiconductor pillars 20 within the dummy cell region DR is present on the substrate 90 without being connected by the pipe portion. However, the multiple semiconductor pillars 20 within the dummy cell region DR may be connected by the pipe portion.

The conductive layer 22D within the dummy cell region DR includes the same material as the conductive layer (the word line and the control gate electrode) 22 within the memory cell region MR.

The conductive layer 22D is electrically connected in common to the dummy cells DC of the multiple dummy cell regions DR at the same level above the substrate 90 as the conductive layer 22D without being divided for every dummy cell region DR (every block). The conductive layer 22D that is in common connection to the multiple dummy regions (dummy cells) DR is referred to as the dummy wiring (or, common wiring) DWL.

For example, the conductive layer (dummy wiring) 22D has a planar shape that is a lattice shape. The multiple conductive layers 22D in the lattice shape are stacked on the substrate 90.

The conductive layer 22D is separated from the conductive layer 22 in the shape of comb teeth.

One memory cell region MR is between two dummy cell regions DR, and the conductive layer (dummy wiring) 22D in the lattice shape surrounds the conductive layer (word line) 22 within each memory cell region MR.

Extension wiring LL and LLS that are provided on a layer higher than the conductive layers 22 and 22D connect the word line WL and the select gate lines SGDL and SGSL within the memory cell region MR to multiple control lines (not illustrated) that are provided within a region outside of the dummy wiring DWL, respectively.

As illustrated in FIG. 4, arrangement of the contact plug CP that is connected electrically to each of the stacked conductive layers 22 deviates from the direction (column direction) parallel to the surface of the substrate. For that reason, the multiple extension wiring LL and LLS may be arranged within the same layer.

Moreover, with regard to the wiring that includes the stacked conductive layer, a line width (for example, a line width of the protrusion portion) of the wiring on a lower layer (substrate side) tends to be equal to or more than a line width of the wiring on a higher layer (in the direction of a bit line) according to the number (height of the stack structure) of the stacked conductive layers. As a result, a distance between each adjacent wiring on a lower layer may be smaller than a distance between each adjacent wiring on a higher layer.

For example, in a terminal of the memory cell array 10, a contact plug CPD and an extension line LLD connect the dummy wiring DWL to the voltage control circuit 199 electrically. In an extension portion 220D of the dummy wiring DWL, the stack structure of the dummy wiring DWL has the same shape of stairs as the word line (conductive layer in the shape of comb teeth) WL. In the extension portion 220D of the dummy wiring DWL, the flash memory according to the present embodiment may apply a voltage to the dummy wiring DWL and the dummy region DR.

In a process of testing the memory that includes the dummy region DR within the memory cell array 10 according to the present embodiment, if a short circuit between the memory cell region MR and the dummy region DR is checked for, in the flash memory according to the present embodiment, a specific voltage is applied to the dummy wiring DWL and leakage current is measured that flows between the word line WL and the dummy wiring DWL. The flash memory according to the present embodiment checks whether or not the short circuit is present between the memory cell region MR and the dummy region DR, based on an amount of detected leakage current.

For example, according to the present embodiment, during operation of the memory, such as when the data writing (programming) is performed and when the data reading is performed, the dummy wiring DWL is in a floating state without the voltage being applied to the dummy wiring DWL.

In the three-dimensionally structured semiconductor memory, if the word line and the like that are stacked on the substrate is processed, the processing is performed in the direction perpendicular to the surface of the substrate.

For example, in a case of a three-dimensionally structured NAND type flash memory, in the processing of the conductive layer for forming the word line, a deep slit is formed within the stack structure that includes the multiple conductive layers. If the forming of the slit remains unfinished, there is a likelihood of maintaining a state where a portion that has to be divided, of the conductive layer is connected. Considering such an etching effect in the conductive layer, the test for detecting whether or not the short circuit is present between each wiring is performed.

If the dummy region is present between the memory cell regions (blocks) and the dummy region that is isolated in a boundary of the memory cell region includes the dummy wiring in the floating state, even though the short circuit occurs between the word line and the dummy wiring, in some cases, the short circuit between the dummy region and the memory cell region is difficult to be detected.

In the semiconductor memory 1 according to the present embodiment (for example, a stacked-type NAND flash memory), the multiple dummy regions DR within the memory cell array 10 are connected to the common wiring DWL, and the voltage may be applied to the multiple dummy regions DR through the common wiring DWL.

Accordingly, in the semiconductor according to the present embodiment, the leakage current may be measured between the word line WL and the dummy wiring DWL, and the short circuit may be detected between the memory cell region MR and the dummy region DR.

Furthermore, due to an increase in storage capacity of the memory (memory cell region), it is necessary to provide the multiple dummy regions in the memory cell array, and checking every isolated dummy region for the short circuit between each dummy region and the memory region is a complicated process.

The checking of all the dummy regions DR within the memory cell array 10 for the short circuit between the memory region MR and the dummy region DR may be performed at the same time by the common wiring DWL connecting the multiple dummy regions DR like in the semiconductor memory 1 according to the present embodiment.

As a result, according to the present embodiment, the high-reliability semiconductor memory may be provided at a lower cost and a shorter period of time without performing a complicated test on the multiple dummy regions DR provided within the memory cell array 10.

According to the present embodiment, the dummy region (stack structure of the dummy cell) may be prevented from collapsing because the multiple dummy regions DR within the memory cell array 10 are connected to the common wiring DWL.

Furthermore, in a method of manufacturing the semiconductor memory according to the present embodiment, which is described below, with the multiple dummy regions DR connected to the common wiring, the multiple conductive layers 22 stacked on the substrate 90 may reduce an occurrence of the stack structure having a high aspect ratio and may prevent the stack structure from collapsing, when performing processing into the pattern that has to be formed. In addition, in the method of manufacturing the semiconductor memory described below, the number of processing defects in the conductive layer may be decreased.

As described above, according to the present embodiment, an occurrence of the number of defects may be decreased, and even though the defect occurs, it is possible to detect defects that occur.

Therefore, according to the present embodiment, the three-dimensionally structured semiconductor memory may be provided that has the high reliability.

b. Test Method

Figure 7:
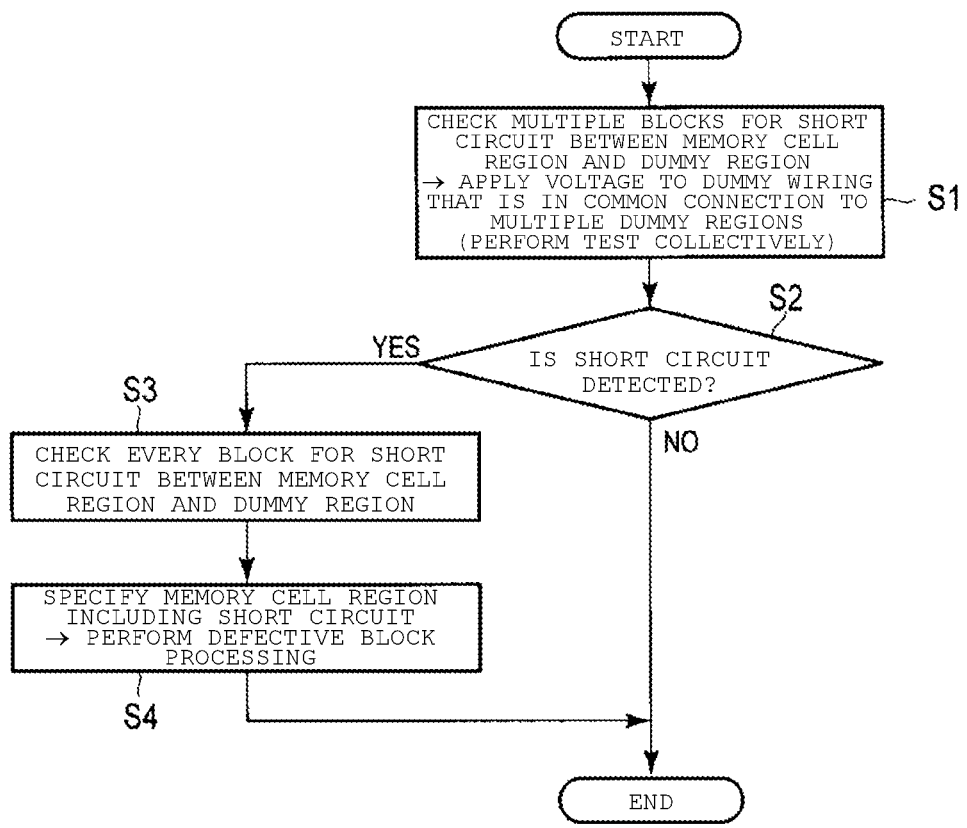
FIG. 7 is a flow chart illustrating an operation example of the semiconductor memory according to the embodiment.

A method of testing the semiconductor memory (three-dimensionally structured NAND flash memory) according to the present embodiment is described with referring to FIG. 7. At this point, FIGS. 2 to 6 also are referred to in an appropriate manner.

In the test process that is performed after a wafer level or packaging, a test apparatus that is connected to the semiconductor memory according to present embodiment performs test to detect the short circuit between the memory cell region and the dummy region within the semiconductor memory 1 according to the present embodiment (Step S1).

With control of the test apparatus, the voltage control circuit 199 applies a voltage (hereinafter referred to as a test voltage) for the test to the dummy wiring DWL that is connected to the dummy region DR in order to detect the short circuit between the memory cell region (block) MR and the dummy region DR.

As described with referring to FIGS. 2 to 6, in the flash memory according to the present embodiment, the common dummy wiring DWL connects the multiple dummy regions DR between the memory cell regions MR.

For that reason, in the semiconductor memory 1 according to the present embodiment, the voltage control circuit 199 applies the test voltage to the multiple dummy regions DR collectively, through the common dummy wiring DWL, without applying the test voltage to every dummy region DR. The voltage control circuit 199 applies the test voltage sequentially to each stacked dummy wiring DWL. For example, the voltage control circuit 199 sets the word line WL to have low voltage compared to voltage of the dummy wiring DWL. However, according to the present embodiment, when the test voltage is applied, the word line WL may be set to have high voltage, and the dummy wiring DWL may be set to have low voltage.

With application of the test voltage to the multiple dummy regions DR, the test apparatus measures the leakage current between the word line and the dummy wiring DWL.

Based on a result of measuring the leakage current, it is checked whether or not the short circuit between the memory cell region MR and the dummy region DR (short circuit between the word line WL and the dummy wiring DWL on the same layer) is present (Step S2).

If the short circuit is not detected between the memory cell region (word line) and the dummy region (dummy wiring) (for example, if the measured leakage current is a tolerance value or below), with the application of the test voltage to the multiple dummy regions DR in a collective manner, the checking of the memory cell region MR and the dummy region DR for the short circuit is ended in the semiconductor memory 1.

If with the application of the test voltage to the multiple dummy regions DR, an amount of leakage current above the tolerance value occurs between the word line WL and the dummy wiring DWL, it is determined that the short circuit between the memory cell region WR and the dummy region DR is present within the memory cell array 10.

If the short circuit is detected between the memory cell region MR and the dummy region DR, the test apparatus checks every memory cell region (block) MR for the short circuit between the memory cell region MR and the dummy region DR that are adjacent to each other (Step S3).

The checking of the word line WL and the dummy wiring DWL for the short circuit in every memory cell region MR is performed on every word line WL within the memory cell region MR. In the semiconductor memory according to the present embodiment, under the control of the test apparatus, the voltage control circuit 199 applies the test voltage to every the conductive layer 22 in the shape of comb teeth and sets the dummy wiring DWL to be at a lower voltage compared to the test voltage.

If the short circuit between the memory cell region MR and the dummy region DR is detected in Step S3 of performing a test for detecting the short circuit in every the memory cell region MR, with defective block processing, defect information is assigned to the block that corresponds to the memory cell region including the short circuit (Step S4). Accordingly, the block that corresponds to the memory cell region MR in which the short circuit is detected is excluded from objects that are subject to management.

After the test for detecting the short circuit in every memory cell region MR, the test for detecting the short circuit between the memory cell region MR and the dummy region DR is ended in the semiconductor memory 1 according to the present embodiment.

As described above, in the semiconductor memory 1 according to the present embodiment, before performing the test for detecting the short circuit between each wiring in every memory cell region (block) and dummy region that are adjacent to each other, the detecting of the short circuit between the memory cell region (word line) and the dummy region (dummy wiring) is performed collectively on the multiple memory cell regions (blocks) and the multiple dummy regions within one chip.

Accordingly, according to the present embodiment, if the short circuit is not detected between each wiring in the collective test process on the multiple memory cell regions and the multiple dummy regions, the process of testing for the short circuit between the memory cell region and the dummy cell region in every memory cell region is not required.

For that reason, according to the present embodiment, the time for testing the flash memory is shortened.

(c) Manufacturing Method

A method of manufacturing the semiconductor memory according to the present embodiment is described with referring to FIGS. 8 to 13.

c-1. Basic Example

Figure 8:
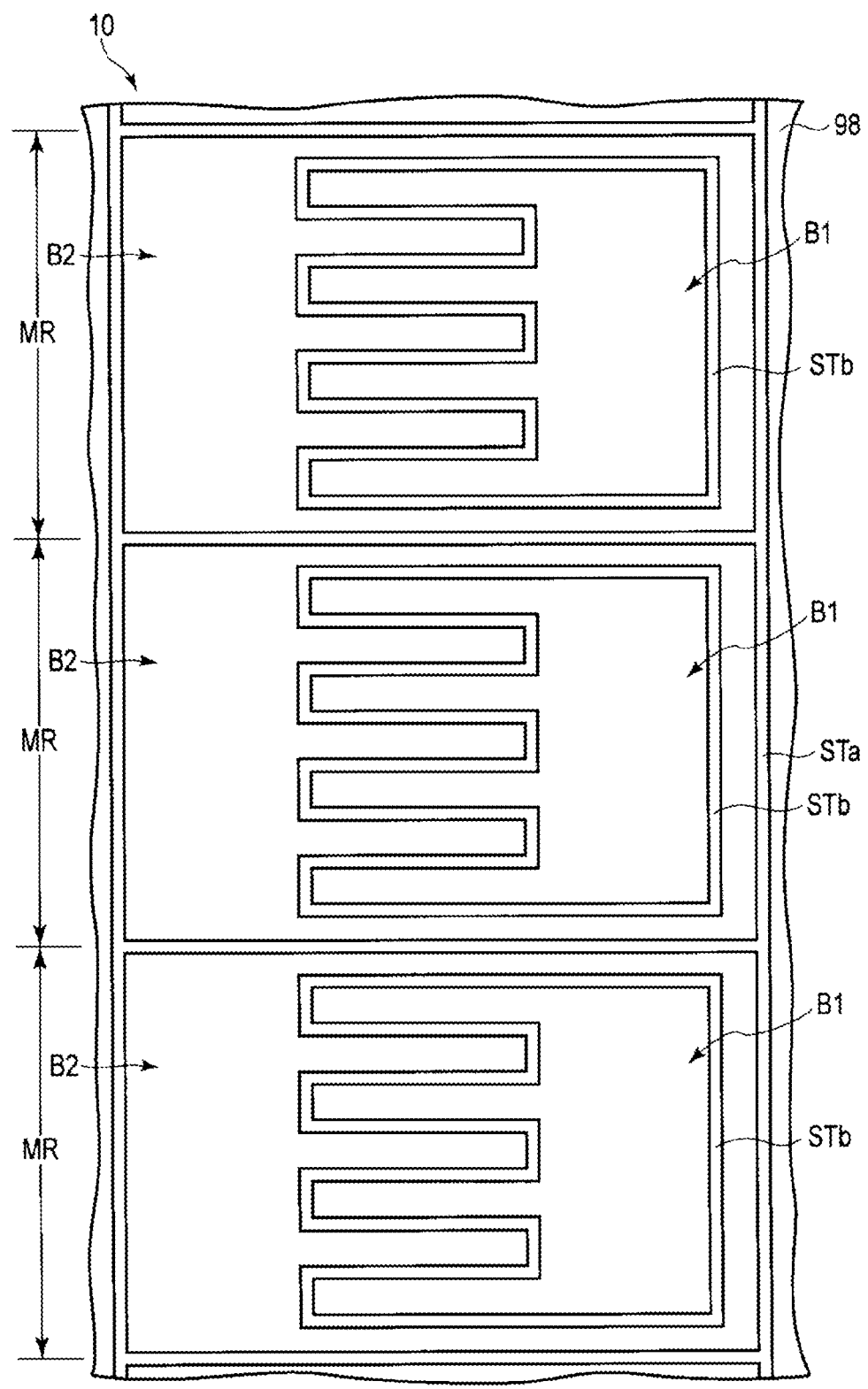
FIG. 8 is a diagram for describing a basic concept behind a method of manufacturing the semiconductor memory according to an embodiment.

A basic example of the method of manufacturing the semiconductor memory according to the present embodiment is described with referring to FIG. 8.

As illustrated in FIG. 8, in the method of manufacturing the semiconductor memory according to the present embodiment, a mask layer 98 is formed on the conductive layer that is stacked on the substrate.

The slit pattern STa in the shape of a closed loop for dividing the conductive layer in every memory cell region (for example, every block) MR is formed within the mask layer 98. The slit pattern STa is in the shape of a rectangular ring pattern and surrounds each memory cell region MR. Based on the slit pattern STa in the closes-loop shape, the conductive layer in each memory cell region MR is partitioned.

Within the memory cell region MR, the slit pattern STb in the shape of a closed loop for patterning the conductive layer in accordance with a wiring pattern that has to be formed is formed within the mask layer 98.

According to the present embodiment, if the pattern in the shape of comb teeth is applied to the wiring pattern for the word line, the slit pattern STb for forming the wiring pattern, for example, is formed along a periphery of the pattern in the shape of comb teeth, in such a way that the pattern that has to be formed within the conductive layer becomes a pattern in the shape of comb teeth. The slit pattern STb for forming a pattern in the shape of comb teeth is a pattern in the shape of a closed loop that includes a meandering pattern (hereinafter referred to as a slit pattern in the shape of comb teeth).

The slit pattern STb in the shape of comb teeth is provided within a region inside of the rectangular slit pattern STa in the direction parallel to the surface of the substrate.

In a large number of slit patterns STa and STb in the shape of a closed loop that are formed within the memory cell array 10, a pattern B1 inside of the slit pattern STb becomes a wiring pattern B1 within the memory cell region MR. Furthermore, a pattern B2 between the two slit patterns STa and STb becomes a wiring pattern B2 within memory cell region MR. With the two slit patterns STa and STb, the two conductive layer patterns B1 and B2 are formed within the one memory cell region MR.

According to the present embodiment, the slit patterns STa and STb are patterns in the shape of a closed loop that are independent of each other, and the slit pattern STb does not intersect the slit pattern STa.

Due to miniaturization of the pattern, the etching defect in the process target layer likely occurs at a position where the slit patterns intersect and in the vicinity of the position.

In the method of manufacturing the semiconductor memory according to the present embodiment, since the slit patterns STa and STb in the shape of a closed loop that are independent of each other are formed within the mask layer, the number of etching defects in the process target layer may be decreased as a result of not forming the position where the slit patterns intersect.

Furthermore, in the method of manufacturing the semiconductor memory according to the present embodiment, since the slit patterns STa and STb are patterns that are independent of each other, the slit patterns STa and STb for different types of patterning may be formed at different timings at the time of the processing of the conductive layer.

For that reason, according to the present embodiment, order in which the slits are formed in the stack structure including the multiple conductive layers may be controlled in such a way that the pattern having the high aspect ratio does not occur during the manufacturing processing.

c-2. Specific Example

One example of the method of manufacturing the semiconductor memory according to the present embodiment is described with referring to FIGS. 9 to 13.

Figure 9:
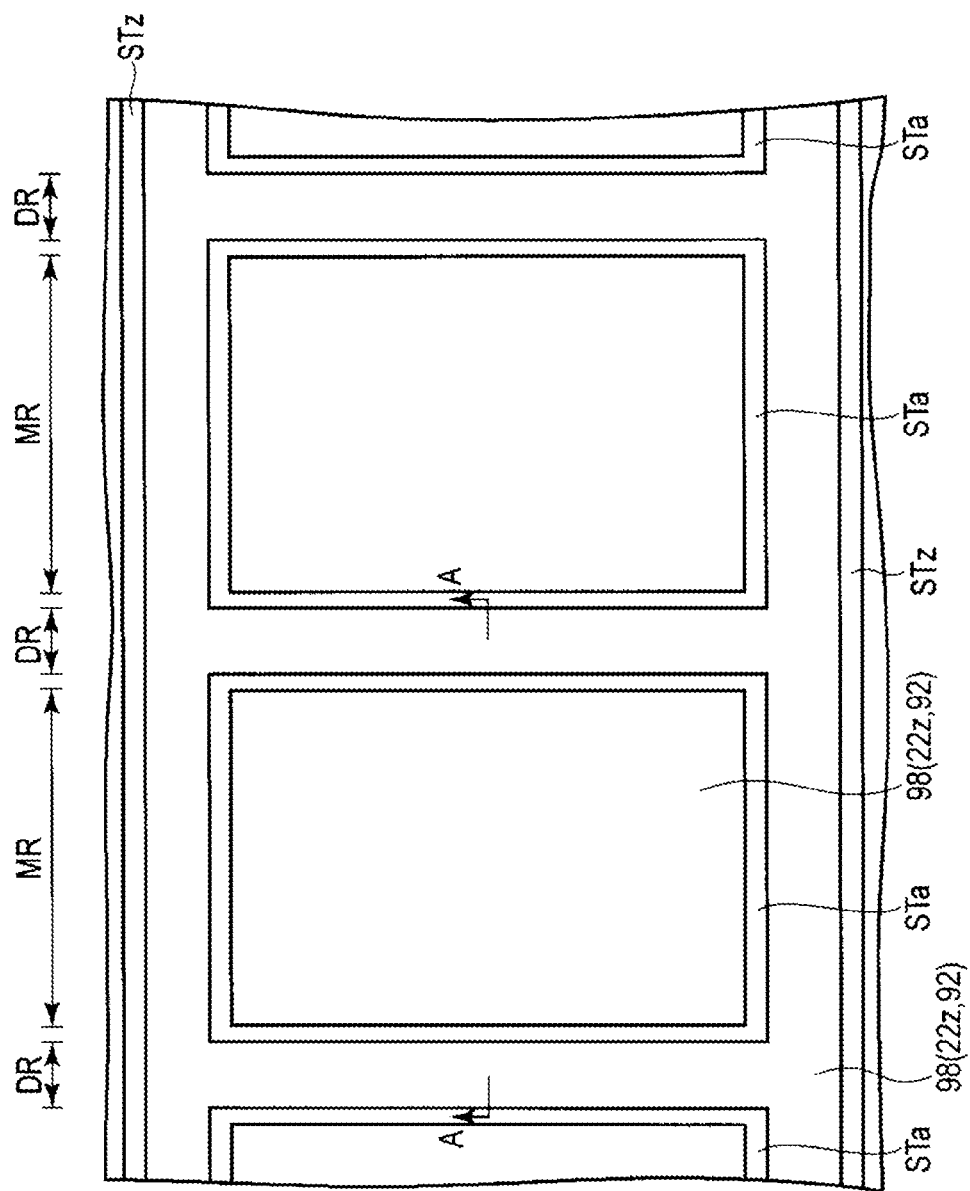
FIG. 9 is a plan diagram illustrating one process of the method of manufacturing the semiconductor memory according to the embodiment.
Figure 10:
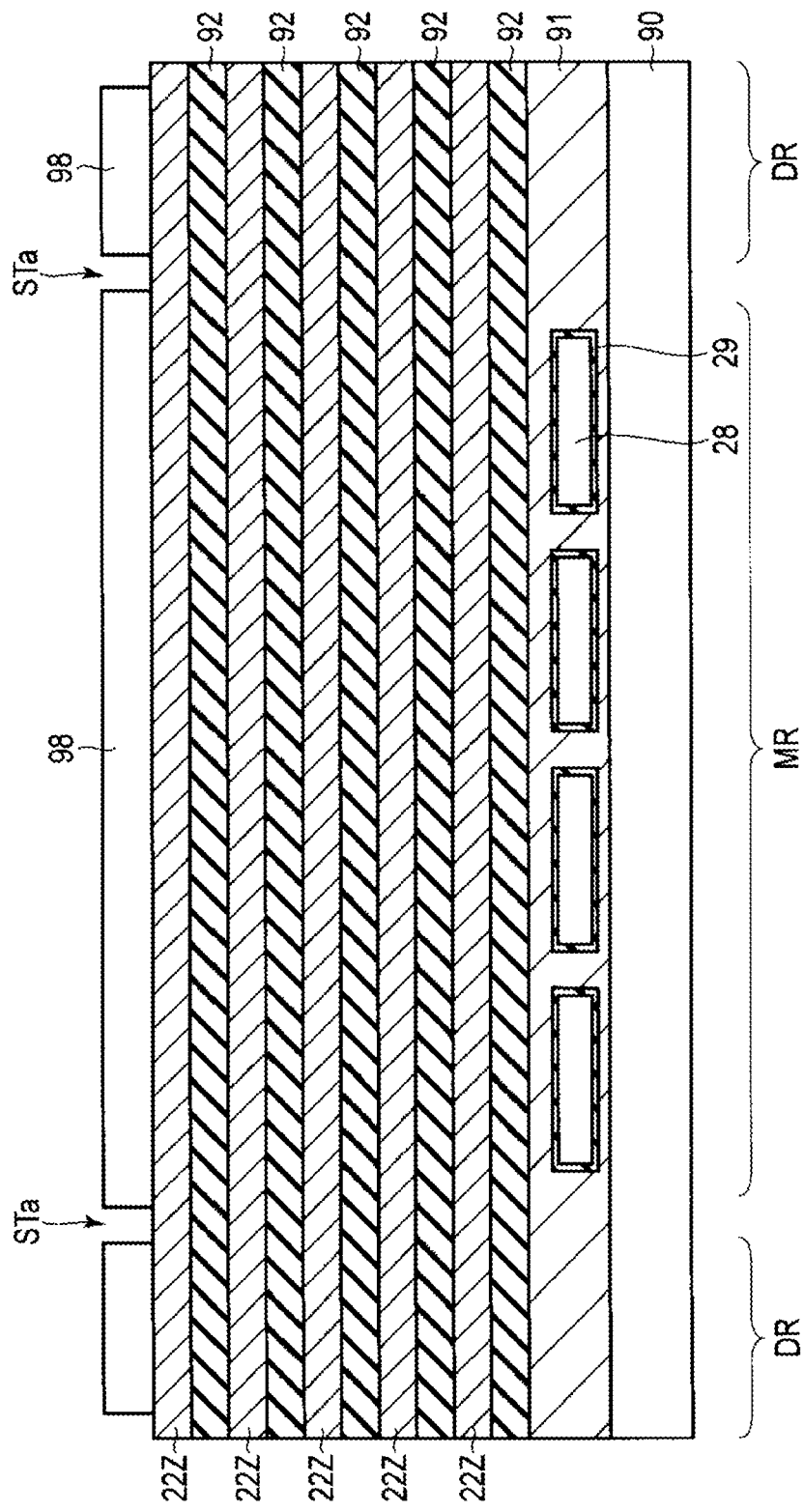
FIG. 10 is a cross-sectional diagram illustrating one process of the method of manufacturing the semiconductor memory according to the embodiment.

As illustrated in FIGS. 9 and 10, in a position within the memory cell array 10, in which the memory cell unit is formed, the pipe portion (semiconductor layer) 28 and the insulating film 29 covering the pipe portion 28 are formed within the conductive layer (back gate layer) BG that is deposited on the substrate 90. Thereafter, an insulating film 92 is deposited on a back gate layer BG.

Each of multiple conductive layers 22z and each of the multiple insulating films 92 are alternately deposited on top of each other on the insulating film 92.

Then, the mask layer (for example, a hard mask layer) is formed on the stack structure that includes the multiple conductive layers 22z and the multiple insulating film 92.

The slit pattern STa in the shape of a closed loop is formed within the mask layer 98 with a photolithography or sidewall transfer technology.

At this point, the slit pattern STa is a pattern for partitioning the memory cell region (block). For that reason, the slit patterns STa (pattern in the shape of a rectangular ring) of which the number depends on the number of blocks that are provided within the memory cell array 10 are formed within the mask layer 98 in such a way that the slit patterns STa are parallel to the column direction.

For example, a slit pattern STz for separating the memory cell array and the other regions (for example, a region in which a peripheral circuit is formed) is formed. The slit pattern STz does not intersect the slit pattern STa. The slit pattern STz may have a pattern in the shape of a closed loop that surrounds the memory cell array. A pattern between the slit pattern STz and the slit pattern STa becomes the dummy wiring pattern for connecting the multiple dummy regions DR.

Figure 11:
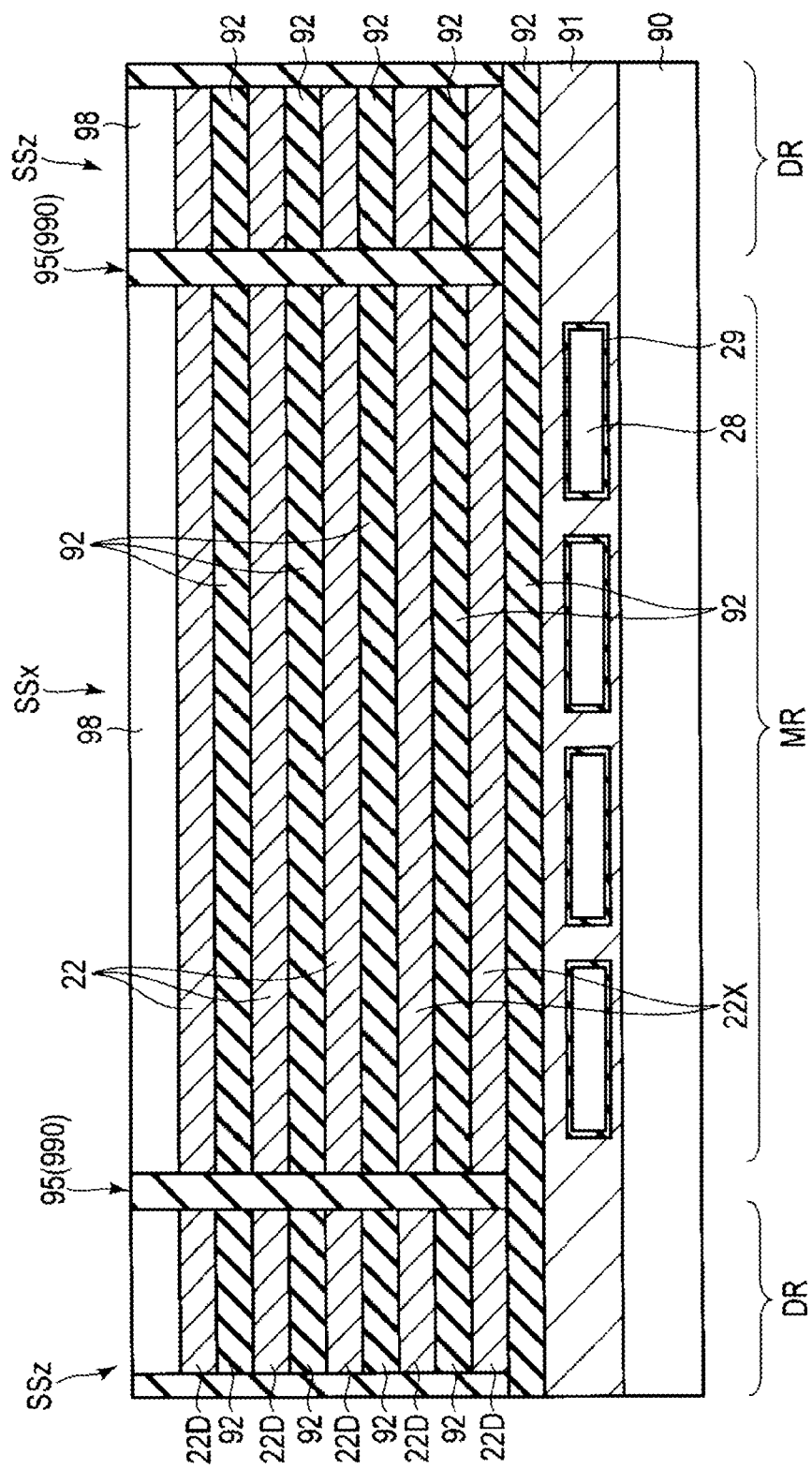
FIG. 11 is a cross-sectional diagram illustrating one process of the method of manufacturing the semiconductor memory according to the embodiment.

As illustrated in FIG. 11, based on the slit pattern STa, a stack structure SSx that includes conductive layers 22X and the insulating films 92 is formed on the substrate in such a way that the conductive layer 22 and the insulating film are sequentially processed and are independent of one another in every memory cell region (block) MR.

With the slit pattern STa and the slit pattern STz that are independent of each other, the memory cell region MR is partitioned on the substrate 90, and a stack structure SSz that corresponds to the wiring pattern for connecting the multiple dummy cell regions DR is formed within a region outside of the memory cell region MR.

The stack structure SSz includes the multiple conductive layers 22D as the dummy wiring DWL and the insulating film 92. With the two slit patterns, that is, the slit patterns STa and STz, the stack structure SSz is formed in such a way to have a planar shape in lattice.

With the processing that is based on the slit patterns STa and STz, a slit 990 is formed between the stack structures SSx and SSz that are separated from each other.

The inside of the formed slit 990 is cleaned using a cleaning solution (or a cleaning gas) and then an insulator 95 is embedded into the slit 990.

Figure 12:
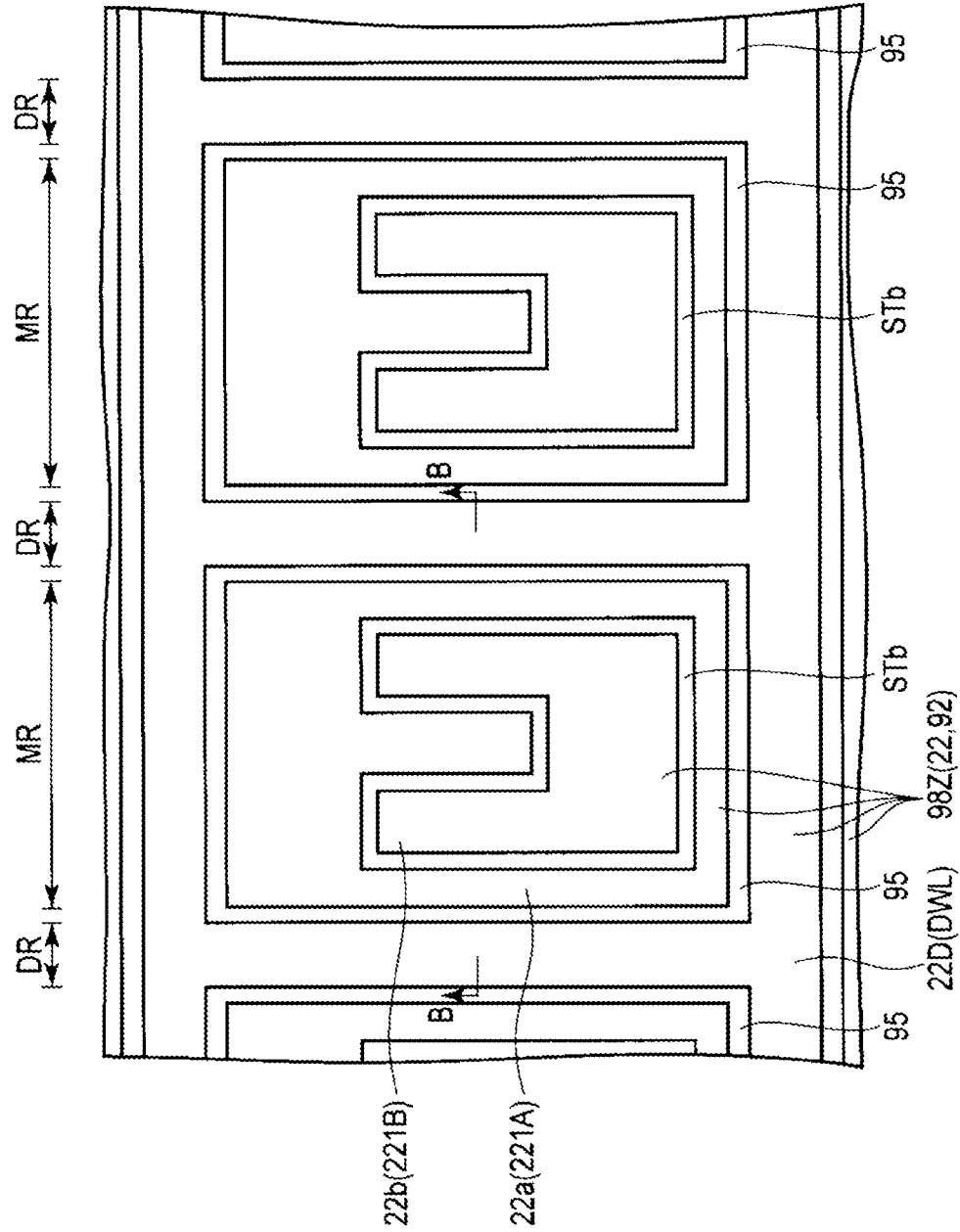
FIG. 12 is a plan diagram illustrating one process of the method of manufacturing the semiconductor memory according to the embodiment.
Figure 13:
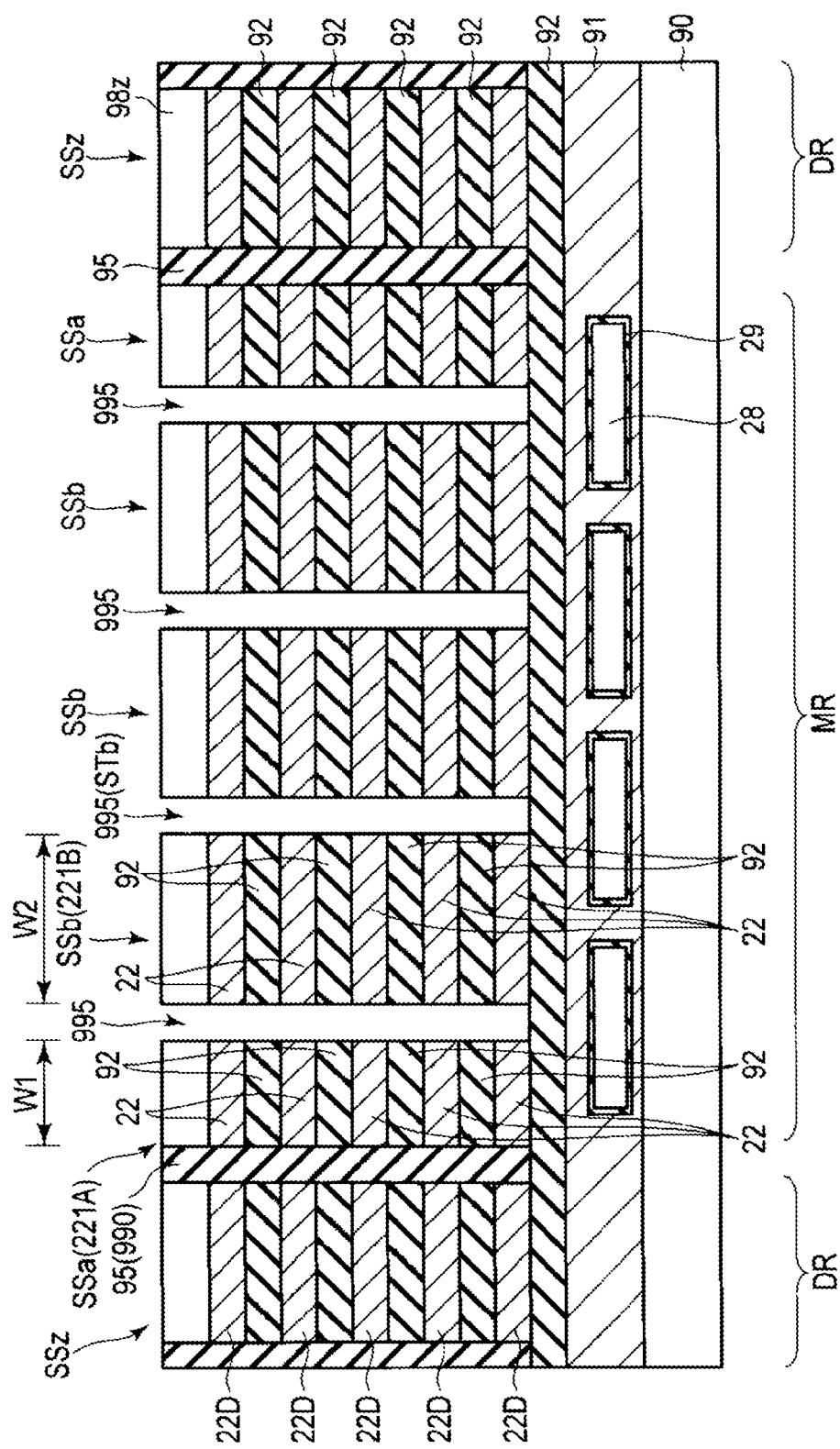
FIG. 13 is a cross-sectional diagram illustrating one process of the method of manufacturing the semiconductor memory according to the embodiment.

As illustrated in FIGS. 12 and 13, within each of the memory cell regions MR, the patterning for processing the conductive layer into the wiring pattern that has to be formed is performed on a mask layer 98z, and the slit pattern STb in the shape of a closed loop is formed within the mask layer 98z. For example, the slit pattern STb in the shape of a closed loop is the slit pattern in the shape of comb teeth.

The slit pattern STb in the shape of comb teeth does not intersect the slit 990 that is formed by the slit pattern for dividing the conductive layer (stack structure) in every memory cell region MR.

Moreover, the mask layer 98z may be the same mask layer as the mask layer (hard mask layer) in which the slit pattern is formed in the previous process, and may be the mask layer that is newly formed on the stack structure in order to form the slit pattern STb in the shape of comb teeth.

Based on the slit pattern STb, the stack structure on the substrate 90 within the memory cell region MR is processed, and a slit 995 is formed.

With the configuration of the memory cell unit of the semiconductor memory according to the present embodiment, a line width W1 of the pattern (protrusion portion) 221A of a stack structure SSa in a termination portion in the column direction within the memory cell region MR is set to approximately half of a line width W2 of the pattern (protrusion portion) 221B of a stack structure SSb in regions (in the direction of the center of the memory cell region MR) other than the termination portion in the column direction within the memory cell region MR.

At this point, one end of the stack structure SSa that has the small line width W1 is joined to a width of the stack structure SSz within the dummy region DR, with the insulator 95 within the slit 990 formed in the previous etching process in between. As a result, the stack structure SSa is supported by the stack structure SSz within the dummy region DR. For example, a width of the stack structure SSz within the dummy region DR is greater than the line width W1 of the stack structure SSa. Furthermore, a depth (height of the stack structure) H1 of the slit formed between the stack structures SSb is a size H1 that depends on the number of the stacked conductive layers. Due to an increase in storage density of the memory, the height H1 of the stack structure tends to increase.

According to the present embodiment, since the stack structure is processed based on the slit patterns in the shape of a closed loop that are independent of each other, a process of processing a region in which the stack structure (stack structure having a high aspect ratio) that has the small line width W1(<W2) is formed may be performed multiple times.

As a result, the number of times that the stack structure SSa having the high aspect ratio of W1 to H1 occurs as the independent pattern on the substrate 90 may be decreased, and an occurrence of the defect, which results from the collapse of the stack structure SSa in such a manufacturing process as when the slit is cleaned between the stack structures, may be suppressed.

In this manner, by etching the stack structure based on the mask layer that has the slit pattern STb in the shape of a closed loop, the conductive layer 22 that is stacked within the memory cell region MR is processed into a shape that has to be formed, and a wiring layer that has the pattern in the shape of comb teeth is formed within each wiring level.

After a cleaning process is performed on the inside of the slit between the stack structures, the insulator is embedded into the slit. Thereafter, as illustrated below, the memory cell and each wiring are formed with a well-known technology.

As illustrated in FIGS. 4 to 6, the memory hole is formed within the protrusion portion of the formed conductive layer (word line) 22 in the shape of comb teeth.

Within the memory hole, a block insulating film, a charge storage layer, and a tunnel insulating film are sequentially formed on a lateral face of the stack structure that includes the conductive layer 22. The semiconductor pillar is formed within the memory hole. Accordingly, the memory cell and the select transistor are formed at the position where the conductive layer and the semiconductor pillar intersect.

The memory cell MC is formed within the memory cell region MR, and at the same time, the dummy cell DC in substantially the same structure as the memory cell MC is formed within the dummy cell region DR.

After the memory cell MC is formed, the selection gate line, the source line SL, the bit line BL and the extension lines LL, LLS, and LLD are formed with a well-known technology.

Moreover, every memory cell region (block) is etched based on the slit pattern STa for dividing the process target layer (stack structure including the multiple conductive layer), and then is etched based on the slit pattern STb for processing the process target layer. However, as opposed to this processing order, with the slit pattern STb, the wiring pattern may be formed within the process target layer, and with the slit pattern STa, the process target layer may be divided in every memory cell region.

According to the present embodiment, an example is illustrated in which the conductive layer is processed into the wiring pattern (at this point, the shape of comb teeth) that has to be formed, and then the memory hole into which the semiconductor pillar is embedded is formed within the processed conductive layer. However, in an alternative embodiment, even if the memory hole is formed within the conductive layer before the conductive layer is formed into the pattern that has to be formed, the processing of the conductive layer, which uses the slit patterns in the shape of a closed loop that are independent of each other, may be applied to the method of manufacturing the semiconductor memory.

The slit pattern STz for separating the memory cell array and the other regions may be formed in a process earlier than the process of forming the slit pattern STa for dividing the conductive layer in every memory cell region (block), and may be formed in a process later than the process of processing the conductive layer within each memory cell region.

As described above, with the method of manufacturing the semiconductor memory according to the present embodiment, the three-dimensionally structured NAND type flash memory is formed.

Due to miniaturization of the processing pattern, the etching defect in the processed layer highly likely occurs at a point where the slit patterns intersect and in the vicinity of the point. Furthermore, if the number of stacked conductive layers (memory cells) is increased in order to increase the storage density of the memory, there is a likelihood that the etching defect (non-opening and non-division) in the conductive layer, a lower layer, will occur.

In the method of manufacturing the semiconductor memory according to the present embodiment, since the slit patterns STa and STb in the shape of a closed loop that are independent of each other are formed within the mask layer, the process target layer (stack structure that includes the multiple conductive layers) may be etched without forming the position where the slit patterns intersect. For that reason, with the method of manufacturing the semiconductor memory according to the present embodiment, the slit pattern may be simplified in such a way that the processing of a member with a high aspect is easy to realize, and thus the etching defect in the process target layer may be reduced.

Furthermore, with the method of manufacturing the semiconductor memory according to the present embodiment, since the slit patterns STa and STb are patterns that are independent of each other, the slit pattern for dividing the stack structure, including the multiple conductive layers, in every block and the slit pattern for processing into the wiring pattern that has to be formed may be formed at different timings at the time of the processing of the stack structure.

Accordingly, in the process of manufacturing the three-dimensionally structured semiconductor memory, the forming of the stack structure having the high aspect ratio as a single pattern may be avoided, and the collapsing of the stack structure may be suppressed.

With the method of manufacturing the semiconductor memory according to the present embodiment, the number of defects in the processing of the semiconductor memory may be decreased, and thus a manufacturing yield of the semiconductor memory may be improved and the cost of the semiconductor memory may be decreased.

d. Modification Example d-1. Modification Example 1

Modification examples of the semiconductor memory according to the present embodiment are described.

The example is described above in which the dummy cell region (dummy wiring) is set to the floating state at the time of the operation (for example, at the time of the use by the user), such as programming or reading the semiconductor memory.

However, at the time of the actual operation of the semiconductor memory according to the present embodiment, first voltage may be applied to the dummy wiring DWL so that the dummy cell region DR is not in the floating state.

At the time of the actual operation of the semiconductor memory, application of the voltage to a dummy word line DWL by voltage control circuit 199 makes it possible for the semiconductor memory according to the present embodiment to decrease a disturbance influence due to a voltage difference between the adjacent blocks and a voltage difference between each adjacent wiring.

d-2. Modification Example 2

Figure 14:
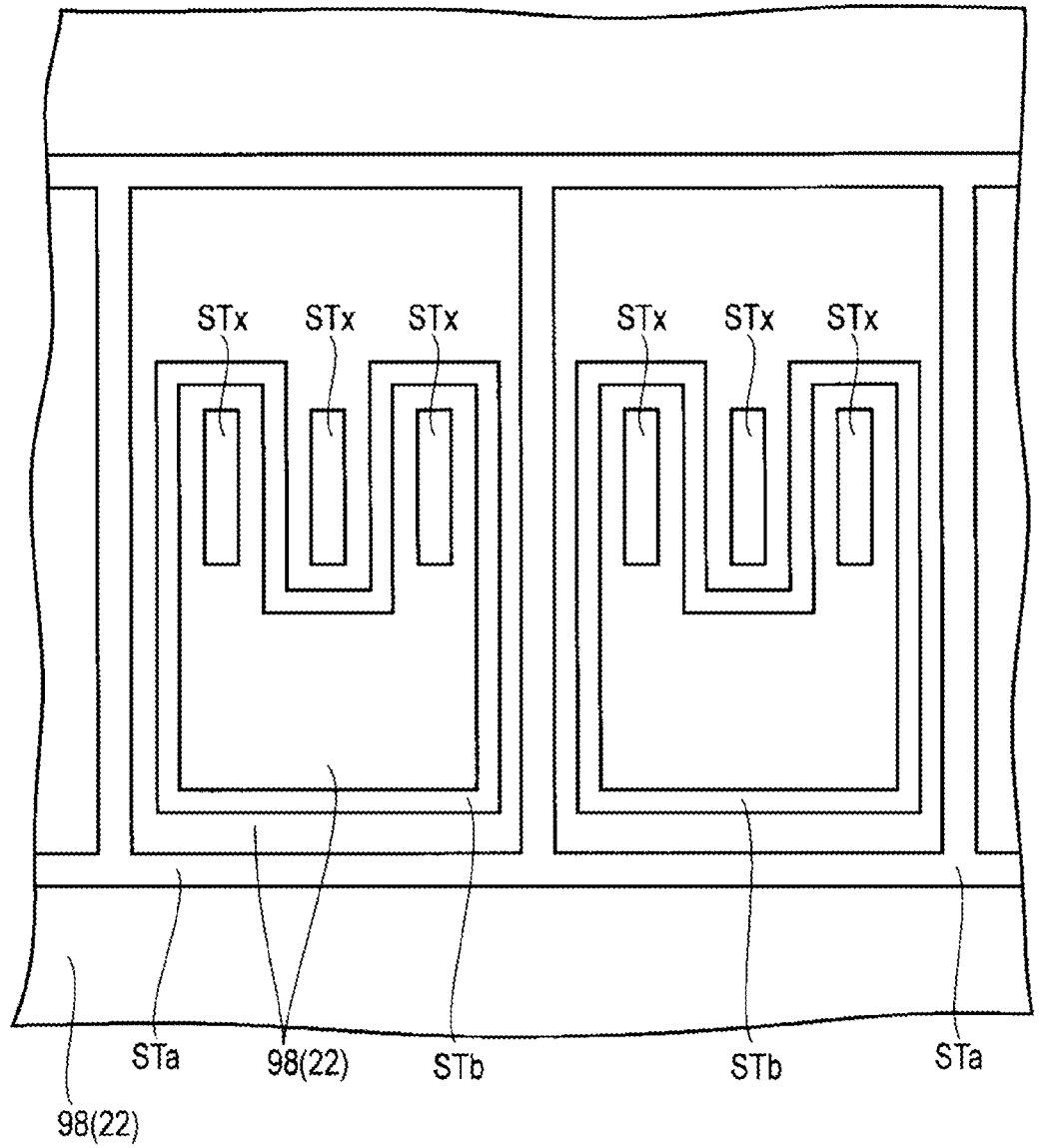
FIG. 14 is a diagram illustrating a modification example of the method of manufacturing the semiconductor memory according to the embodiment.
Figure 15:
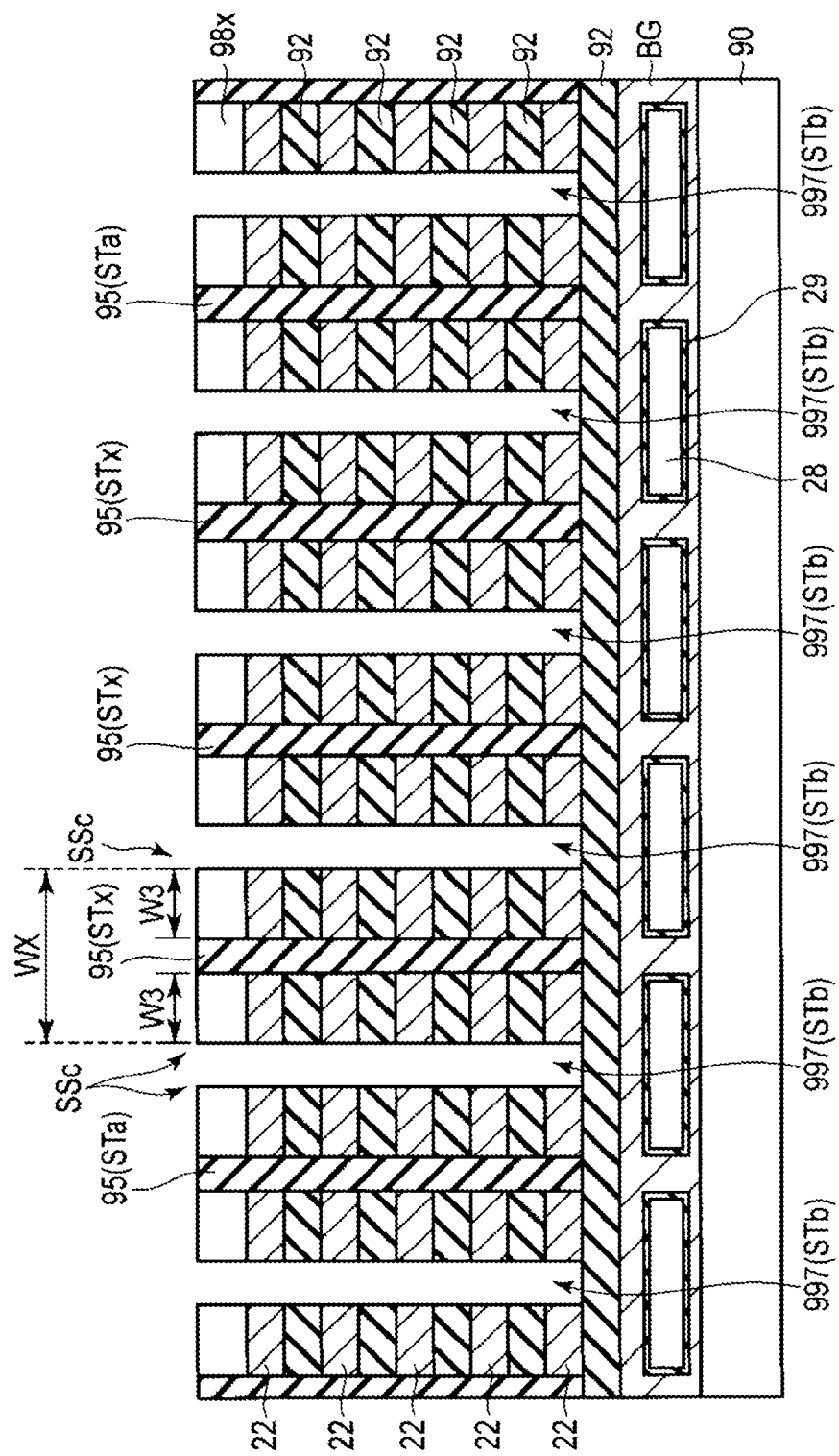
FIG. 15 is a diagram illustrating a modification example of the method of manufacturing the semiconductor memory according to the embodiment.
Figure 16:
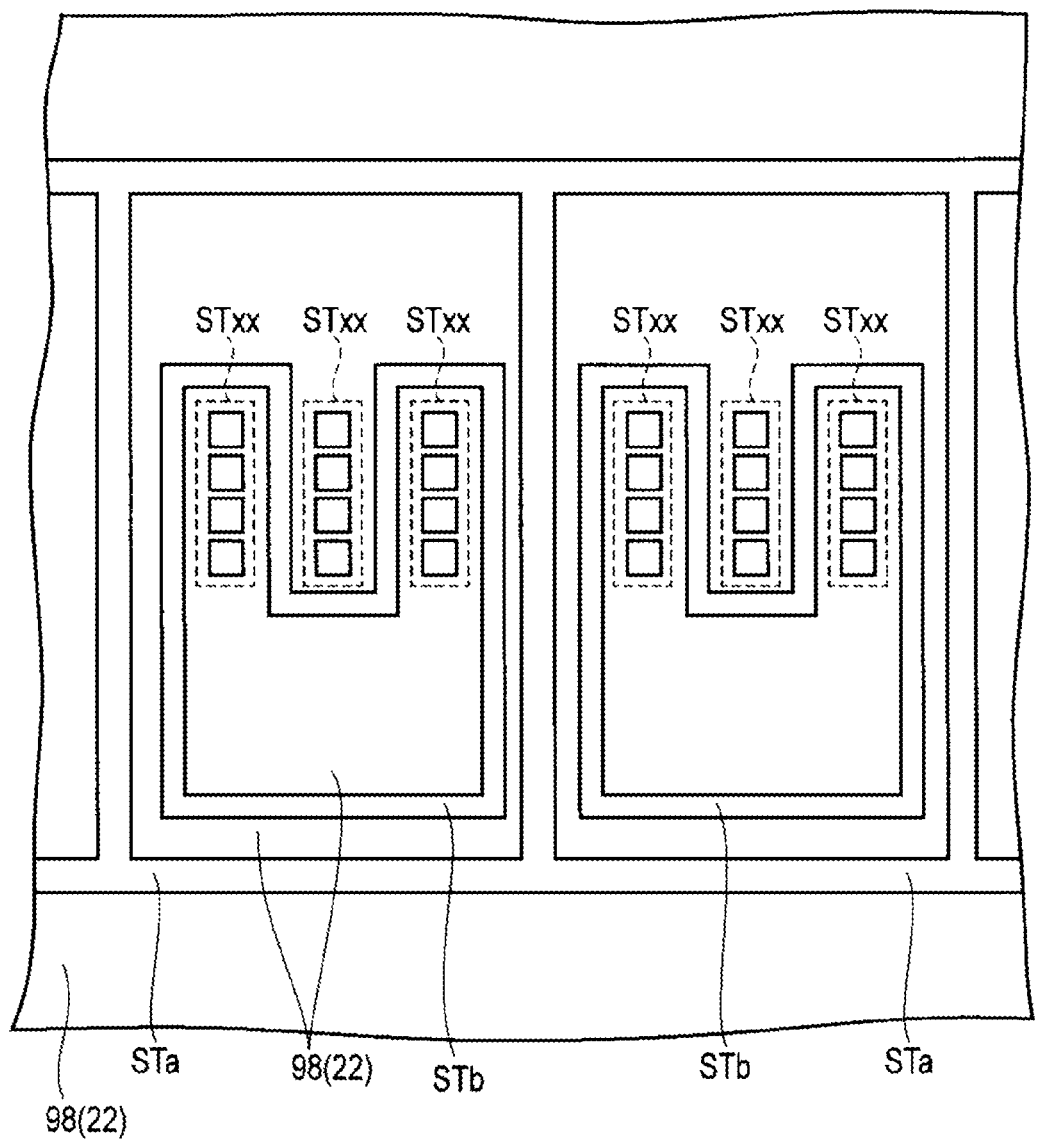
FIG. 16 is a diagram illustrating a modification example of the method of manufacturing the semiconductor memory according to the embodiment.

A modification example of the method of manufacturing the semiconductor memory according to the present embodiment is described with referring to FIGS. 14 to 16.

As illustrated in FIG. 14, in some cases, the dummy region is not present between the memory cell regions, in accordance with the configuration of the semiconductor memory (for example, the three-dimensionally structured NAND type flash memory). If the dummy region is not present within the memory cell array, the storage density and storage capacity of the semiconductor memory may be increased.

In addition, since the stack structure on the pipe portion is divided according to the configuration of the semiconductor memory, or since a region where the source line and a well contact are formed within the memory cell region, in some cases, a slit pattern STx in the shape of a straight line is formed within a protrusion portion of a pattern 22 in the shape of comb teeth.

As illustrated in FIGS. 14 and 15, if the slit pattern STx is formed within a region inside of the slit pattern STb in the shape of a closed loop for forming (pattering the conductive layer) the wiring pattern, many of the patterns (stack structure), each having the high aspect ratio, are formed within the memory cell array, as a result of the line width of the formed pattern being small.

For example, with the etching process based on the slit pattern STb in the shape of a closed loop, the conductive layer (word line) in the shape of comb teeth is formed, and with the etching process based on the slit pattern STx in the shape of a straight line, the slit is formed within the conductive layer in the shape of comb teeth.

In the method of manufacturing the three-dimensionally structured flash memory according to the present embodiment, the slit pattern STx in the shape of a straight line, and the slit patterns STa and STb in the shape of a closed loop are formed within the mask layer at different timings. Accordingly, the etching of the conductive layer, based on the slit patterns STa, STb, and STx, may be performed at different timings.

As illustrated in FIG. 15, for example, before the etching for patterning the conductive layer, based on the slit pattern STb, the slit is formed within the stack structure by etching based on the slit pattern STa for partitioning the memory cell region.

The etching is performed for partitioning the memory cell region, and substantially at the same time, the slit in the shape of a straight line is formed within the stack structure in the memory cell region by etching based on the slit pattern STx.

Thereafter, the insulator 95 is embedded into the slit that is formed based on the slit patterns STa and STx.

Moreover, the forming of the slit pattern STx and the etching of the stack structure, which is based on the slit pattern STx, may be performed at a different timing than the etching of the stack structure, which is based on the slit pattern STa.

After the insulator 95 is embedded into the slit, the slit pattern STb in the shape of a closed loop for patterning the conductive layer is formed within a mask layer 98x. Based on the slit pattern STb, the stack structure is etched, and a slit 997 is formed within the stack structure.

A processed stack structure (conductive layer) SSc includes a portion that has a line width W3. The stack structure SSc has the height H1 in accordance with the number of the conductive layers 22 and the insulating film 92 which are stacked.

At this point, with the insulator 95, the adjacent stack structures SSc are joined.

For that reason, a line width WX of all the adjacent stack structures SSc with the insulator 95 in between is greater than two times a line width W3 of each stack structure SSc. As a result, a WX to H1 aspect ratio of the adjacent stack structures with the insulator 95 in between is equal to or less than half of a W3 to H1 aspect ratio of the stack structure that results if the stack structure with the line width W3 is present as a single pattern.

In this manner, although the dummy region is not provided within the memory cell array, a pattern that has a narrow width is not formed with the one-time etching process, and an occurrence of the pattern having the high aspect ratio may be decreased by processing the stack structure into the pattern, with the process of embedding the slit that is formed by the multiple-times etching process. As a result, the collapsing of the stack structure having the high aspect ratio during the manufacturing process may be suppressed.

As illustrated in FIG. 16, with a layout in the shape of a dash line, multiple linear slits STxx may be formed within the protrusion portion of the conductive layer in the shape of comb teeth.

In this manner, the slit pattern for processing (dividing) the process target layer is formed within each mask layer in such a way as to obtain the patterns in the shape of a closed loop, which are independent of each other, and thus the stack structure, which is the process target layer, may be processed at different timings (processes).

As a result, the occurrence of the pattern having the high aspect ratio may be suppressed, and the collapsing the pattern having the high aspect ratio may be prevented.

For that reason, with the method of manufacturing the semiconductor memory according to the present embodiment, the number of defects in the processing of the semiconductor memory may be decreased, and the manufacturing yield of the semiconductor memory may be improved.

In the method of manufacturing the semiconductor memory according to the present embodiment, the two slit patterns in the shape of a closed loop, which are independent of each other, may be formed within the same mask layer at the same time, and the step of processing the process target layer, which is based on the two slit patterns in the shape of a closed loop, may be performed at substantially the same time.

The present embodiment may be applied also to a flash memory in the structure different from the structure described according to the present embodiment, or to a memory other than the flash memory, such as a ReRAM, a MRAM, or a PCRAM, as long as such a memory is a semiconductor memory that includes the three-dimensionally structured memory cell array which includes the memory cell region and the multiple dummy regions within the memory cell array.

The semiconductor memory according to the embodiments has configurations as in Supplementary Notes 1 to 7 that follow.

Supplementary Note 1

A method of manufacturing a semiconductor memory according to the present embodiment includes a process of forming a stack structure in which multiple insulating films and multiple conductive layers are alternately stacked on a substrate, a process of forming a first slit pattern in the shape of a closed loop within a mask layer on the stack structure, and a process of forming a second slit pattern in the shape of a closed loop that is separated from the first slit pattern within the mask layer.

Supplementary Note 2

In the method according to Supplementary Note 1, the first slit pattern and the second slit pattern are formed in a such way that the first slit pattern and the second slit pattern do not intersect.

Supplementary Note 3

In the method according to Supplementary Note 1 or 2, an insulator is embedded into a slit that is formed within the stack structure, based on the first slit pattern, and then the stack structure is processed based on the second slit pattern.

Supplementary Note 4

In the method according to any one of Supplementary Notes 1 to 3, the first slit pattern is formed within the mask layer in such a way as to surround a region in which the second slit pattern is formed.

Supplementary Note 5

In the method according to any one of Supplementary Notes 1 to 4, the first slit pattern is a pattern for partitioning at least one memory cell region that is provided within a memory cell array, and the second slit pattern is a pattern for forming a wiring pattern within the memory cell region.

Supplementary Note 6

In the method according to any one of Supplementary Notes 1 to 5, a region that is surrounded by the second slit pattern has a planar shape of comb teeth.

Supplementary Note 7

The method according to any one of Supplementary Notes 1 to 6 further includes a step of forming a hole within the stack structure, a step of forming a memory retention portion, of a memory cell, on the conductive layer within the hole, and a step of embedding a semiconductor pillar within the hole.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A memory comprising:
a substrate;
a first region in which a plurality of first word lines are stacked above the substrate and a plurality of first semiconductor pillars extend through the first word lines, wherein first memory cells are formed at intersections of the first semiconductor pillars and the first word lines;
a second region in which a plurality of second word lines are stacked above the substrate and a plurality of second semiconductor pillars extend through the second word lines, wherein second memory cells are formed at intersections of the second semiconductor pillars and the second word lines;
a third region which is disposed between the first region and the second region; and
a plurality of bit lines disposed above the first region, second region, and third region, extending in a first direction, and electrically connected to the first memory cells and the second memory cells,
wherein the first word lines have a first stair shaped portion to which first contacts are connected, and the second word lines have a second stair shaped portion to which second contacts are connected.

2. The memory according to claim 1, wherein
the first contacts are located on a first side of the first memory cells, and the second contacts are located on a second side of the first memory cells opposite to the first side in a second direction, the second direction crossing the first direction.

3. The memory according to claim 2, further comprising:
a control circuit configured to control voltages applied to the first word lines through the first contacts and to the second word lines through the second contacts.

4. The memory according to claim 3, wherein
the first stair shaped portion is located on a side facing away from the second word lines, and the first contacts are connected to upper surfaces of the first word lines that are exposed in the first stair shaped portion, and
the second stair shaped portion is located on a side facing away from the first word lines, and the second contacts are connected to upper surfaces of the second word lines that are exposed by the second stair shaped portion.

5. The memory according to claim 2, wherein
parts of the first and second word lines at a first level above the semiconductor substrate are controlled separately, and
other parts of the first and second word lines at a second level above the semiconductor substrate are controlled separately.

6. The memory according to claim 5, wherein each of the first and second word lines has a planar shape, and
the part of the first word line has a first protruding portion that protrudes towards the second word line, and
the part of the second word line has a second protruding portion that protrudes towards the first word line.

7. The memory according to claim 6, wherein
the first protruding portion and the second protruding portion are adjacent to each other along the first direction.

8. The memory according to claim 5, further comprising:
a plurality of memory strings, each of the memory strings including memory cells that are electrically connected in series and have gates that are electrically connected to the first word lines and the second word lines.

9. The memory according to claim 8, wherein
the memory strings have a U-shape.

10. The memory according to claim 1, wherein the third region includes first dummy cells that are stacked above the substrate.

11. The memory according to claim 10, further comprising:
- a fourth region which is disposed on an opposite side of the third region from the second region and includes second dummy cells,
- wherein a gate of one of the first dummy cells is electrically connected to a gate of one of the second dummy cells.

12. The memory according to claim 11, wherein the plurality of bit lines are electrically connected to the first and second dummy cells.

* * * * *